(12) United States Patent
Shank et al.

(10) Patent No.: US 12,733,262 B2
(45) Date of Patent: Sep. 8, 2026

(54) CHIP INCLUDING SILICON DEVICE AND III-V SEMICONDUCTOR DEVICE ON III-V SEMICONDUCTOR LAYER

(71) Applicant: GlobalFoundries U.S. Inc., Malta, NY (US)

(72) Inventors: Steven M. Shank, Jericho, VT (US); Richard J. Rassel, Essex Junction, VT (US); John J. Ellis-Monaghan, Grand Isle, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 220 days.

(21) Appl. No.: 18/910,190

(22) Filed: Oct. 9, 2024

(65) Prior Publication Data

US 2026/0101587 A1 Apr. 9, 2026

(51) Int. Cl.

| | |
|---|---|
| ***H10D 87/00*** | (2026.01) |
| ***H10D 30/01*** | (2025.01) |
| ***H10D 30/47*** | (2025.01) |
| ***H10D 62/40*** | (2025.01) |
| ***H10D 62/824*** | (2025.01) |
| ***H10D 84/05*** | (2025.01) |
| ***H10P 14/20*** | (2026.01) |
| ***H10P 14/24*** | (2026.01) |
| ***H10P 30/20*** | (2026.01) |
| ***H10P 90/00*** | (2026.01) |
| ***H10W 10/00*** | (2026.01) |
| ***H10W 10/10*** | (2026.01) |

(52) U.S. Cl.

CPC ............. *H10D 87/00* (2025.01); *H10D 84/05* (2025.01); *H10P 14/24* (2026.01); *H10P 14/2907* (2026.01); *H10P 90/1906* (2026.01); *H10W 10/061* (2026.01); *H10W 10/181* (2026.01); *H10D 30/015* (2025.01); *H10D 30/47* (2025.01); *H10D 62/40* (2025.01); *H10D 62/824* (2025.01); *H10P 30/206* (2026.01); *H10P 30/208* (2026.01)

(58) Field of Classification Search

CPC ...... H10D 84/08; H10D 87/00; H10W 10/061
See application file for complete search history.

(56) References Cited

U.S. PATENT DOCUMENTS

| | | | |
|---|---|---|---|
| 8,212,294 | B2 | 7/2012 | Hoke et al. |
| 10,312,260 | B2 | 6/2019 | Cao et al. |

(Continued)

*Primary Examiner* — Raj R Gupta
(74) *Attorney, Agent, or Firm* — Francois Pagette; Hoffman Warnick LLC

(57) ABSTRACT

Disclosed semiconductor structures include a stack of III-V semiconductor layers and a III-V semiconductor device and a silicon device on the stack. The III-V semiconductor device includes, among other components, a barrier layer above and immediately adjacent to a III-V semiconductor surface at the top of the stack in a first area. The silicon device includes, among other components, a silicon-based layer above and immediately adjacent to the same III-V semiconductor surface at the top of the stack in a second area. Thus, the barrier layer and the silicon-based layer are at the same level above the substrate. Optionally, an isolation well can be within the stack adjacent to the III-V semiconductor surface in the second area (e.g., to electrically isolate the III-V semiconductor device from the silicon device). Also disclosed are methods of forming the semiconductor structures.

20 Claims, 26 Drawing Sheets

(56) References Cited

U.S. PATENT DOCUMENTS

| | | | | |
|---|---|---|---|---|
| 2015/0340495 | A1* | 11/2015 | Basu | H10D 30/025 257/329 |
| 2016/0373106 | A1* | 12/2016 | Shah | H10D 62/115 |
| 2020/0135766 | A1 | 4/2020 | Dutta et al. | |
| 2020/0219878 | A1* | 7/2020 | Then | H10D 84/856 |

* cited by examiner

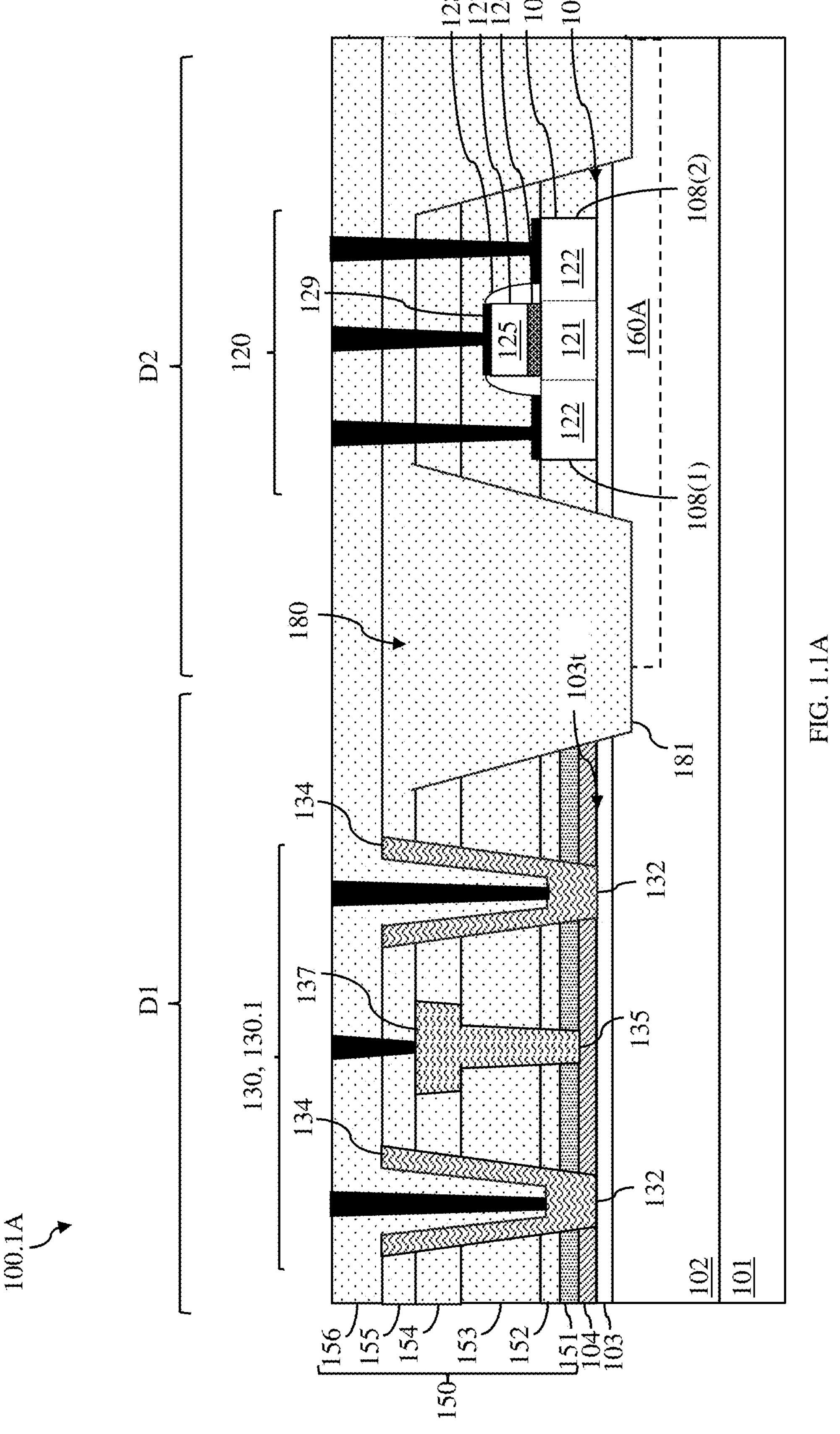
FIG. 1.1A

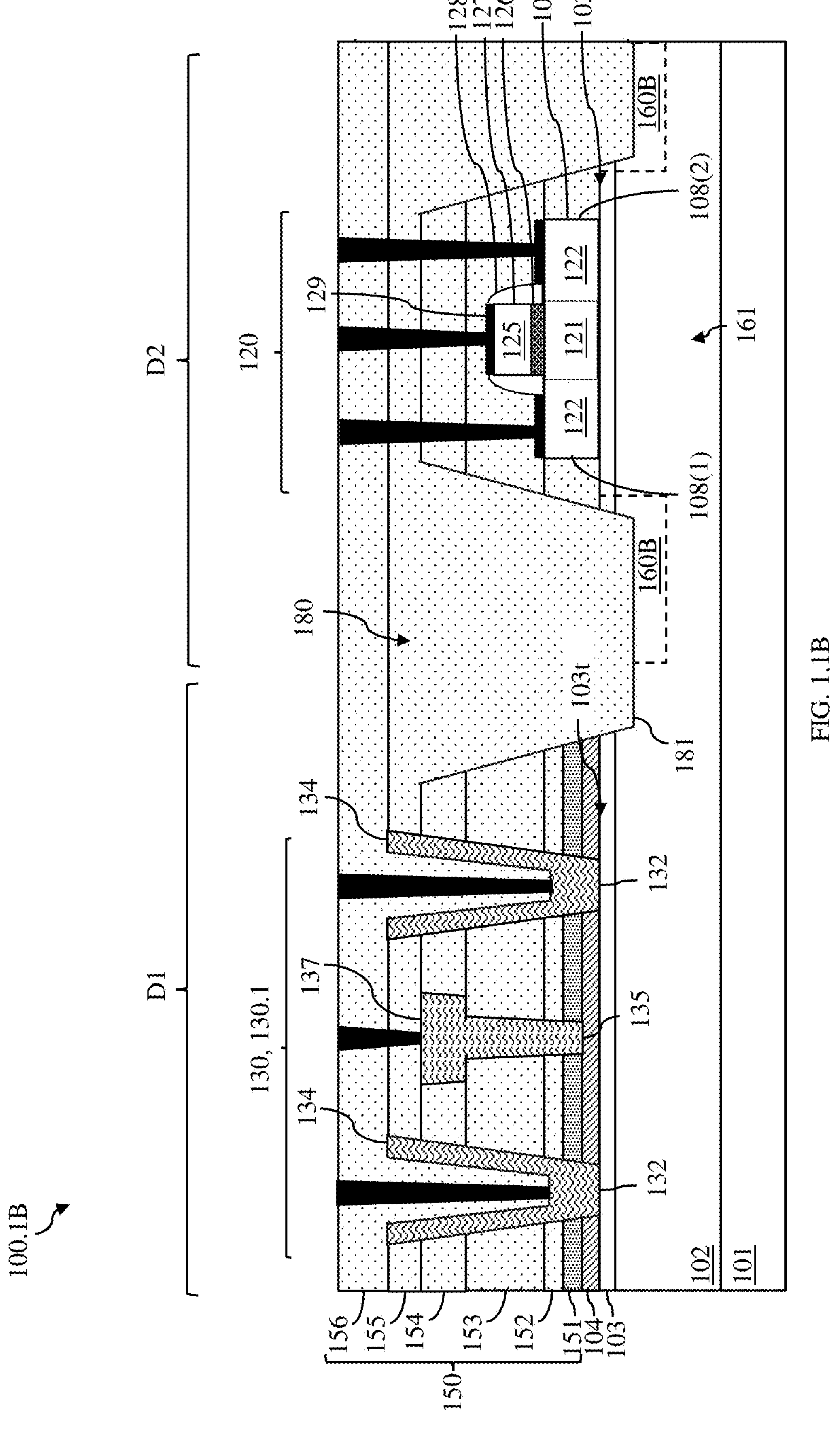
FIG. 1.1B

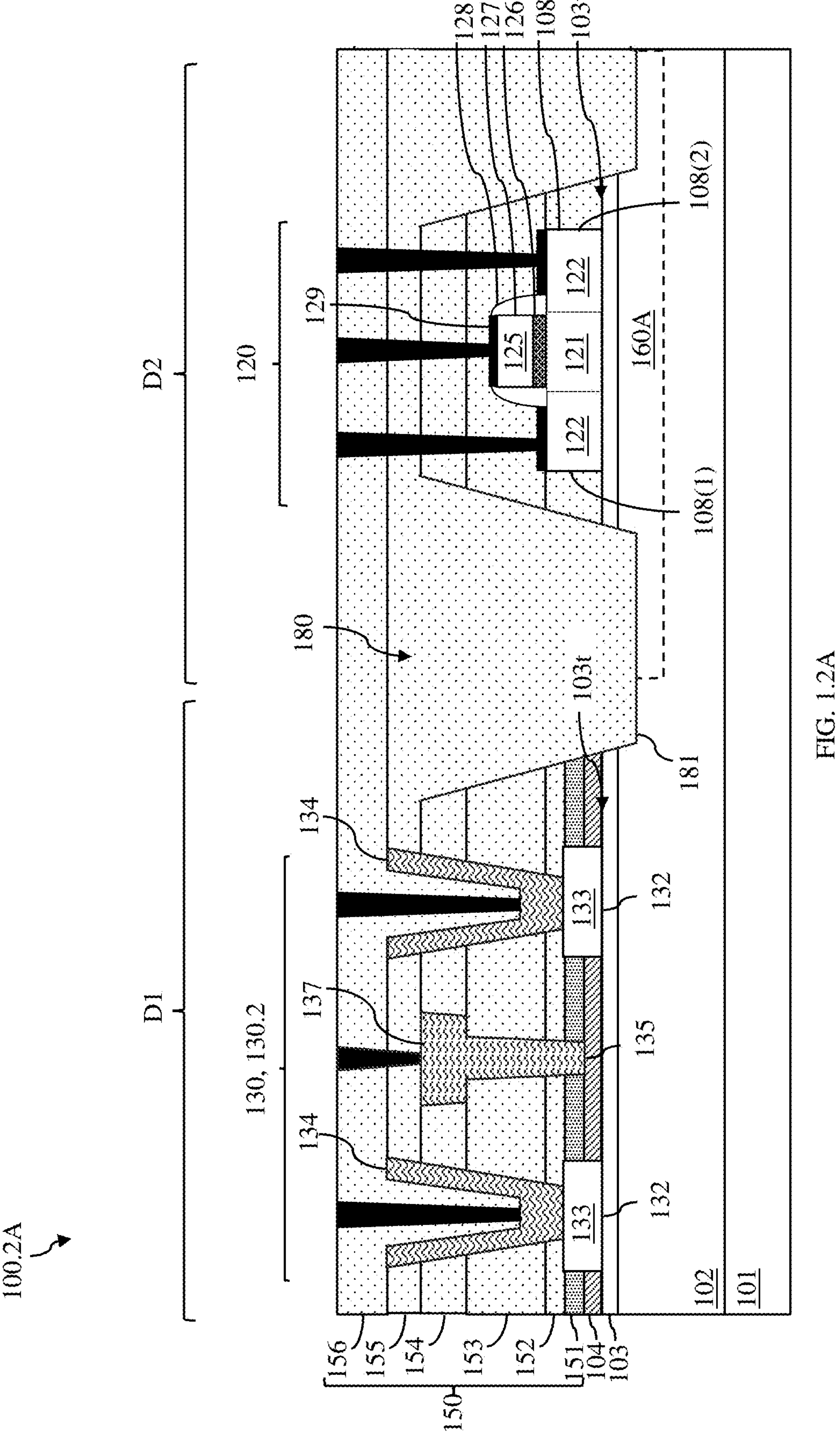
FIG. 1.2A

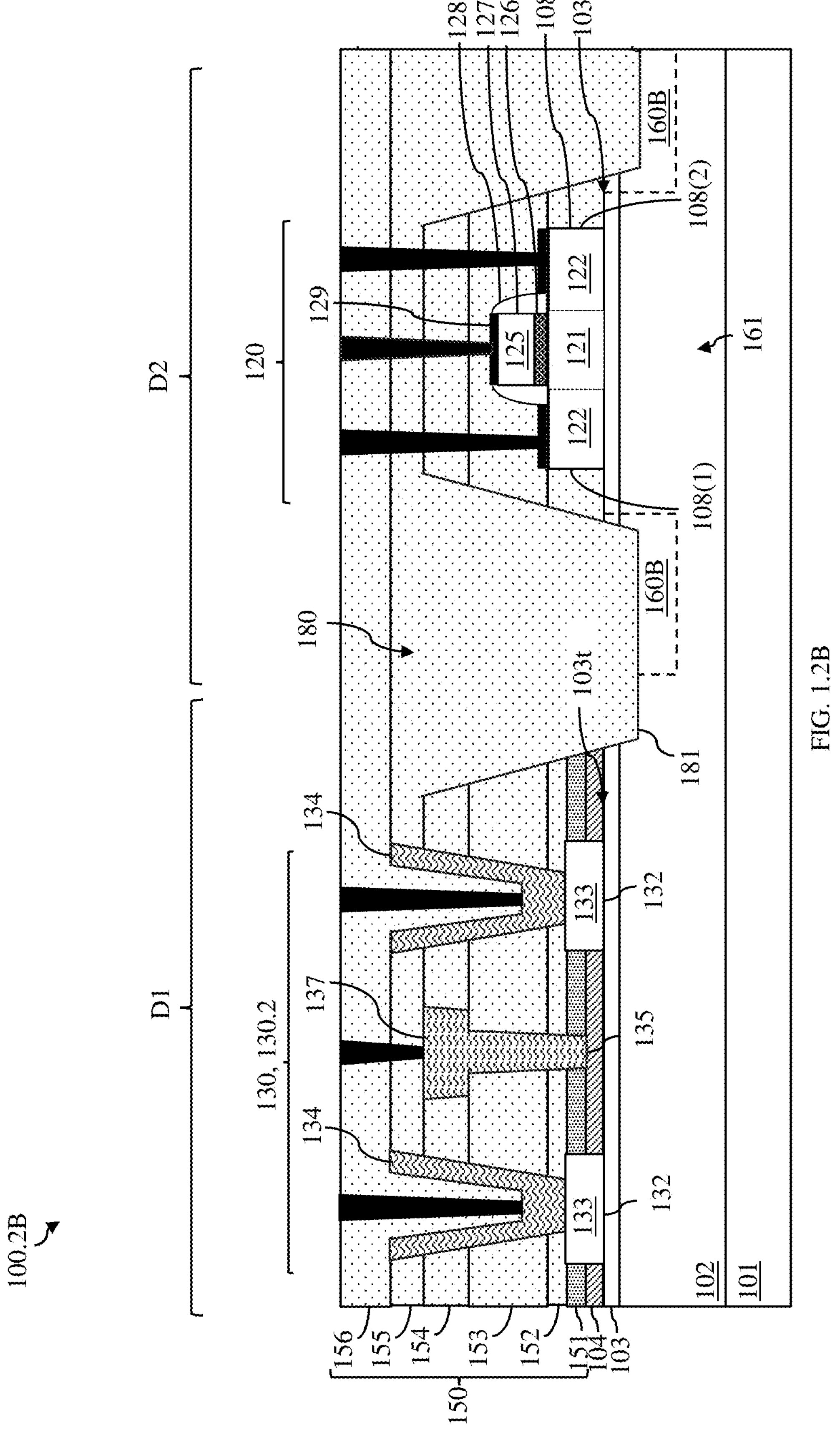
FIG. 1.2B

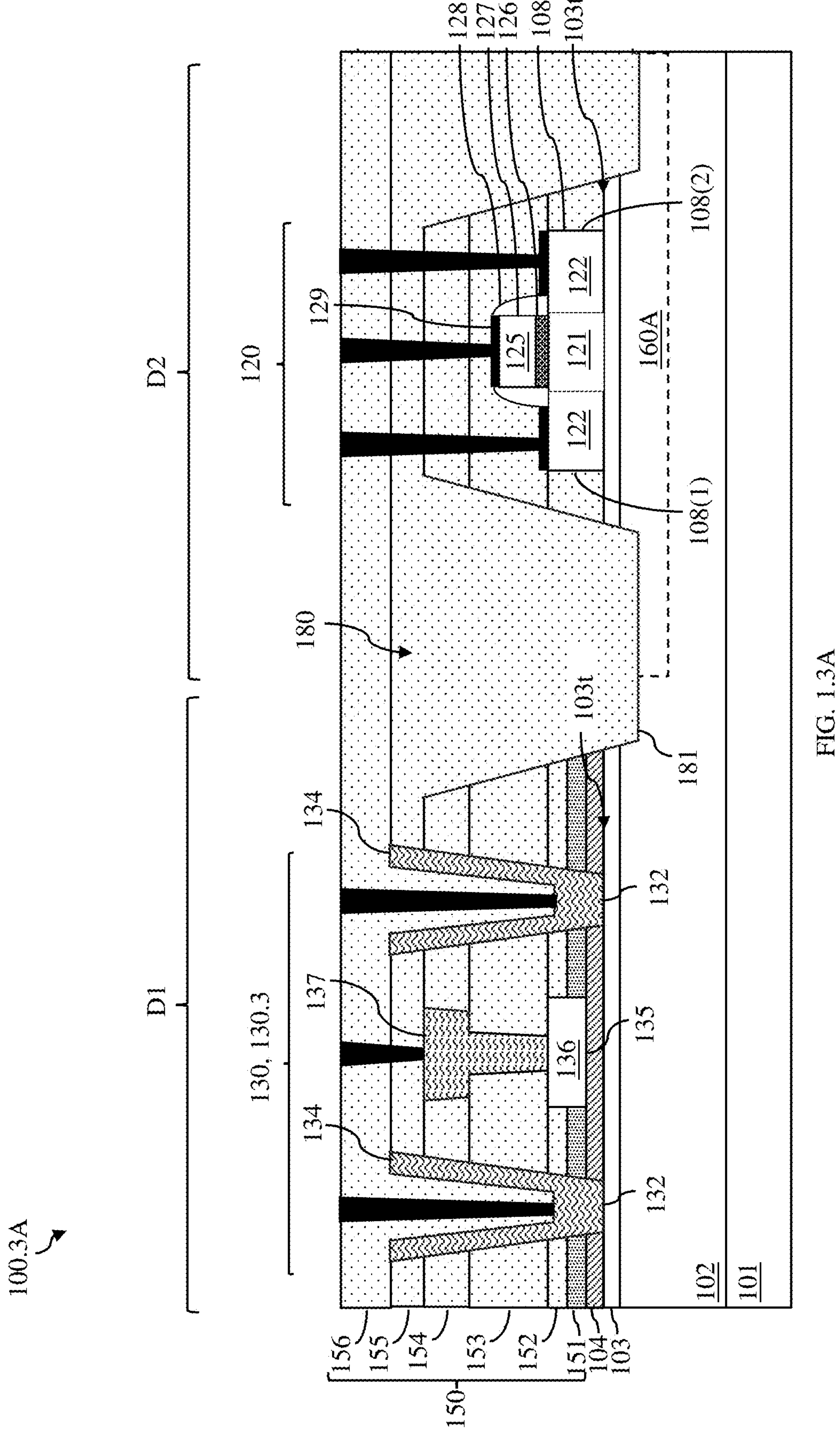
FIG. 1.3A

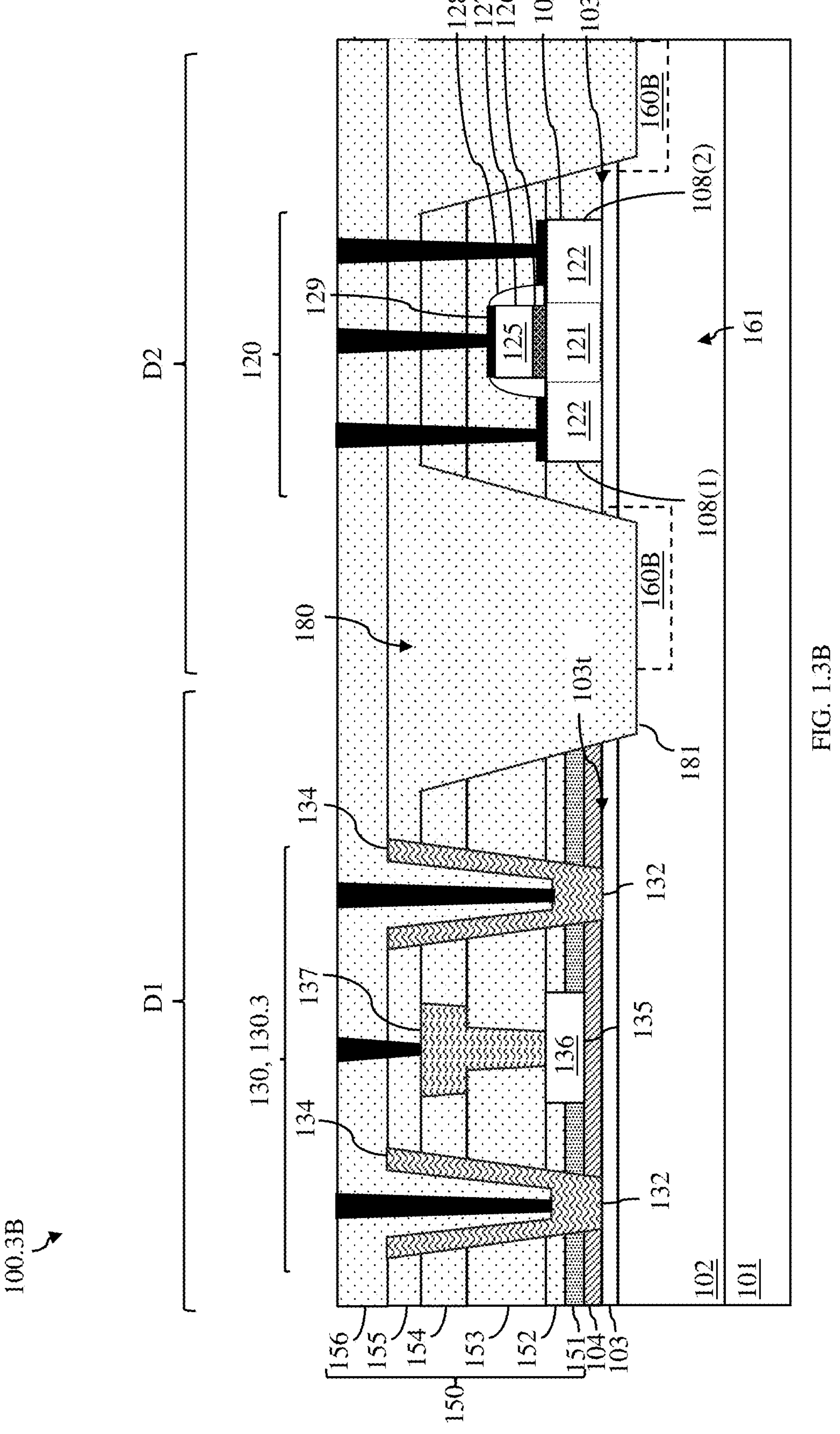
FIG. 1.3B

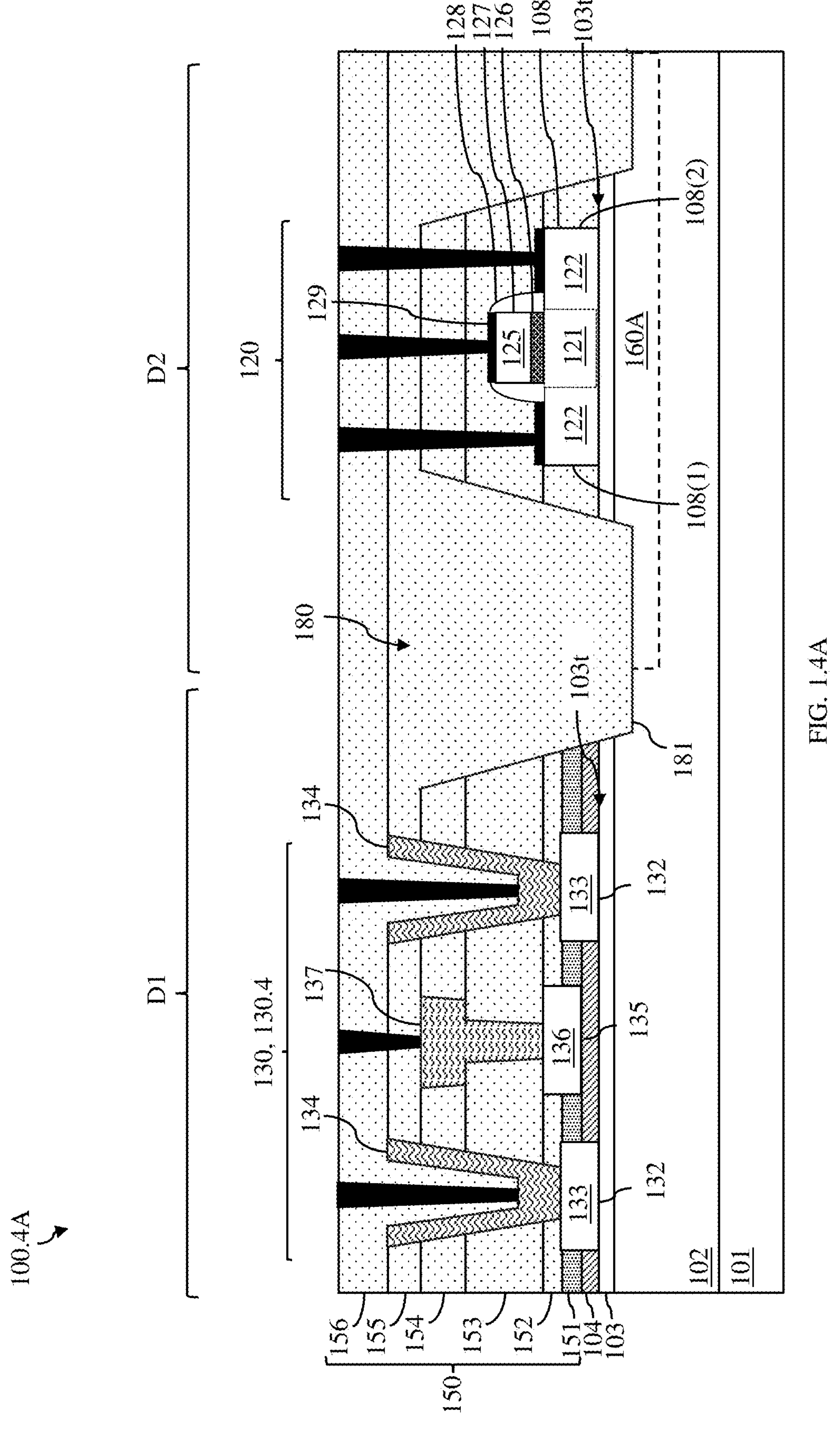
FIG. 1.4A

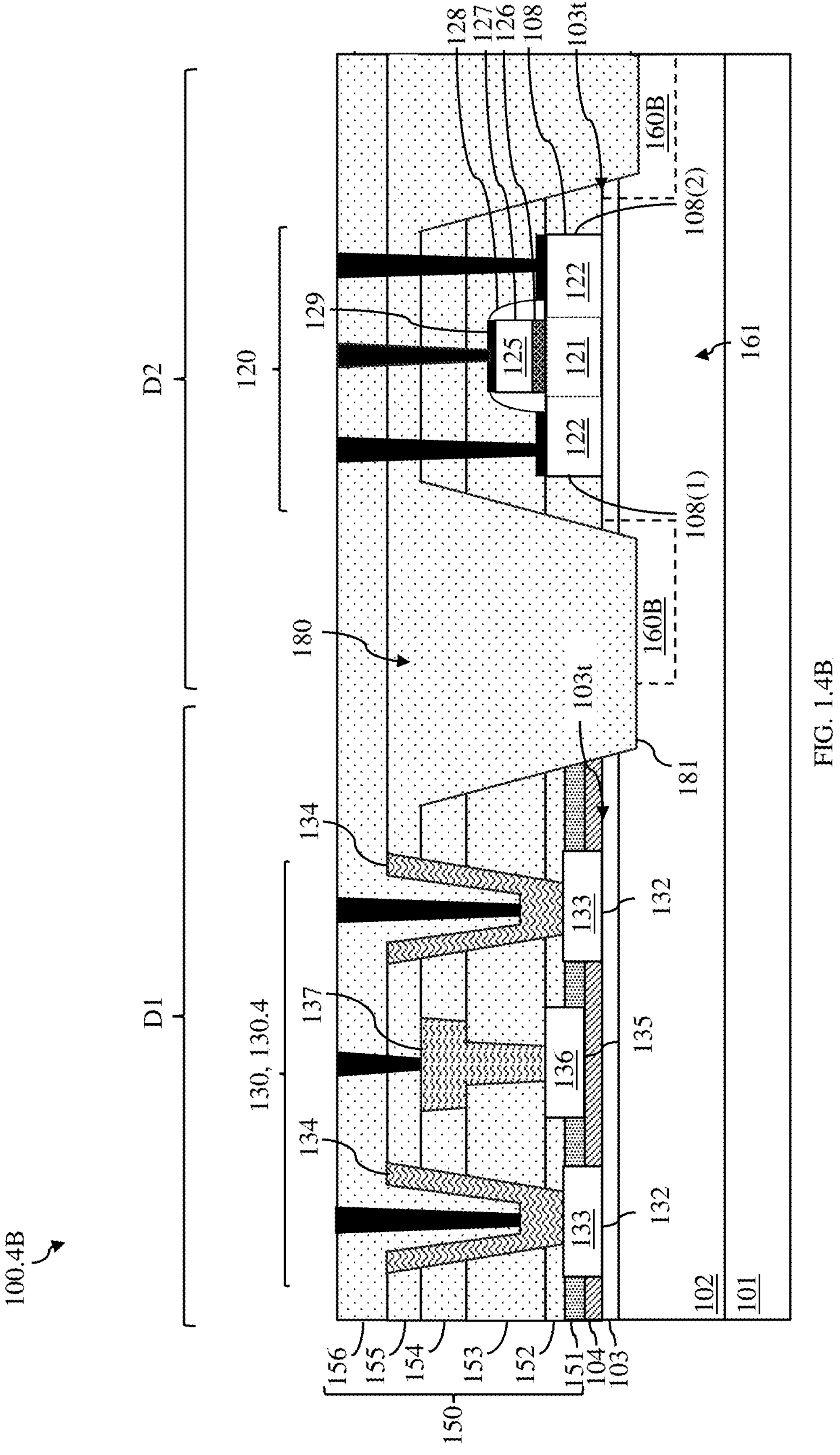
FIG. 1.4B

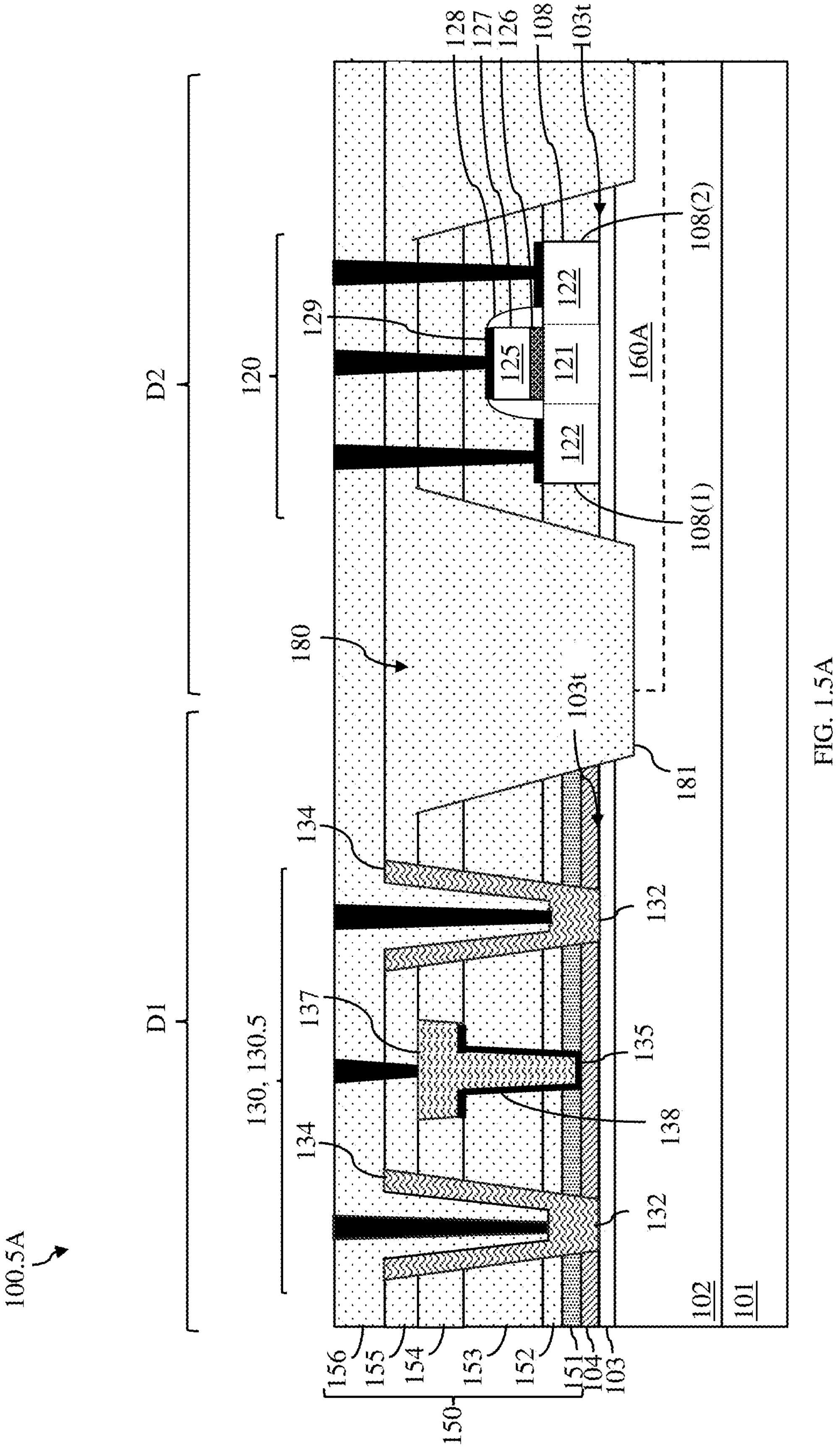
FIG. 1.5A

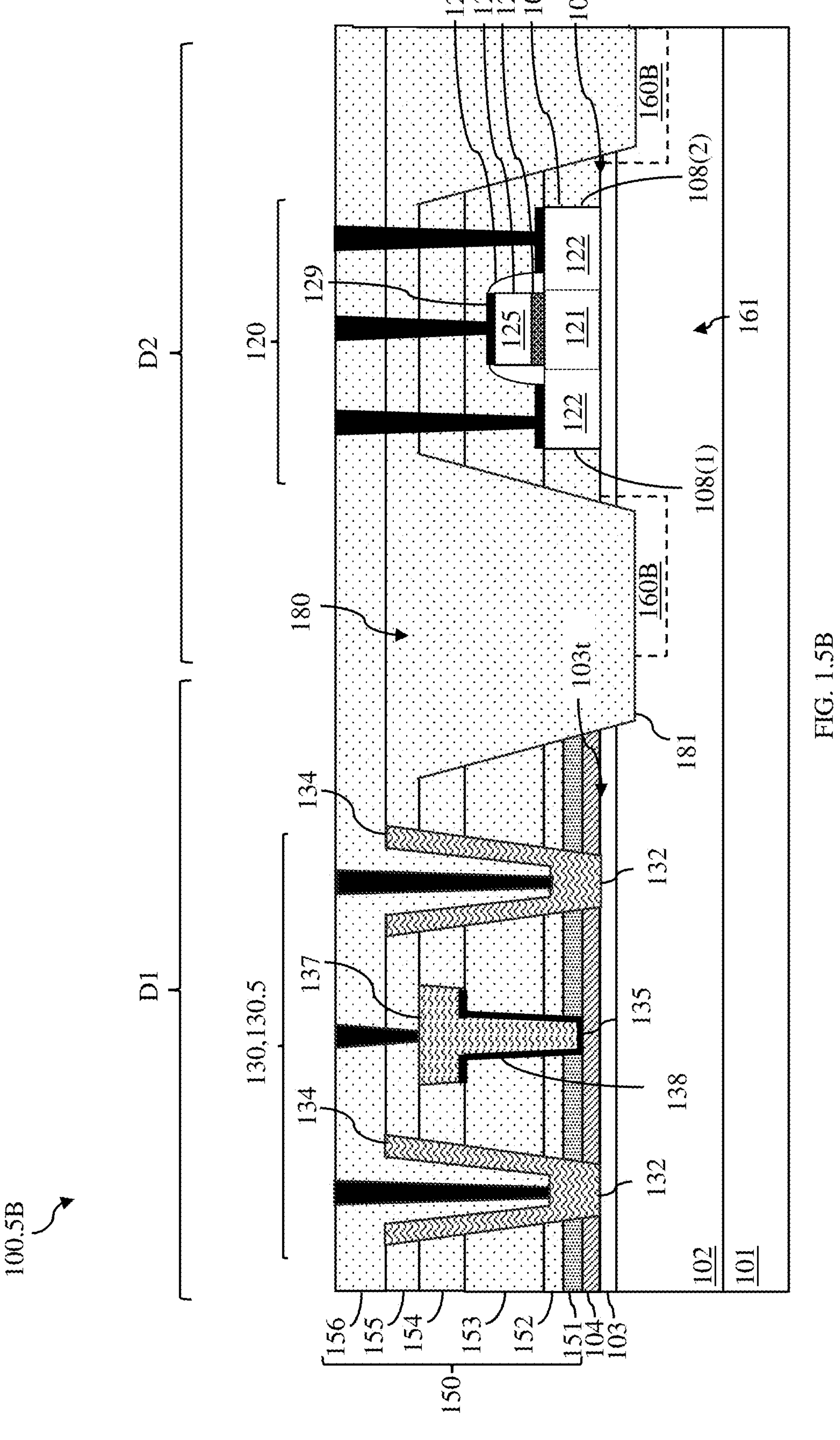
FIG. 1.5B

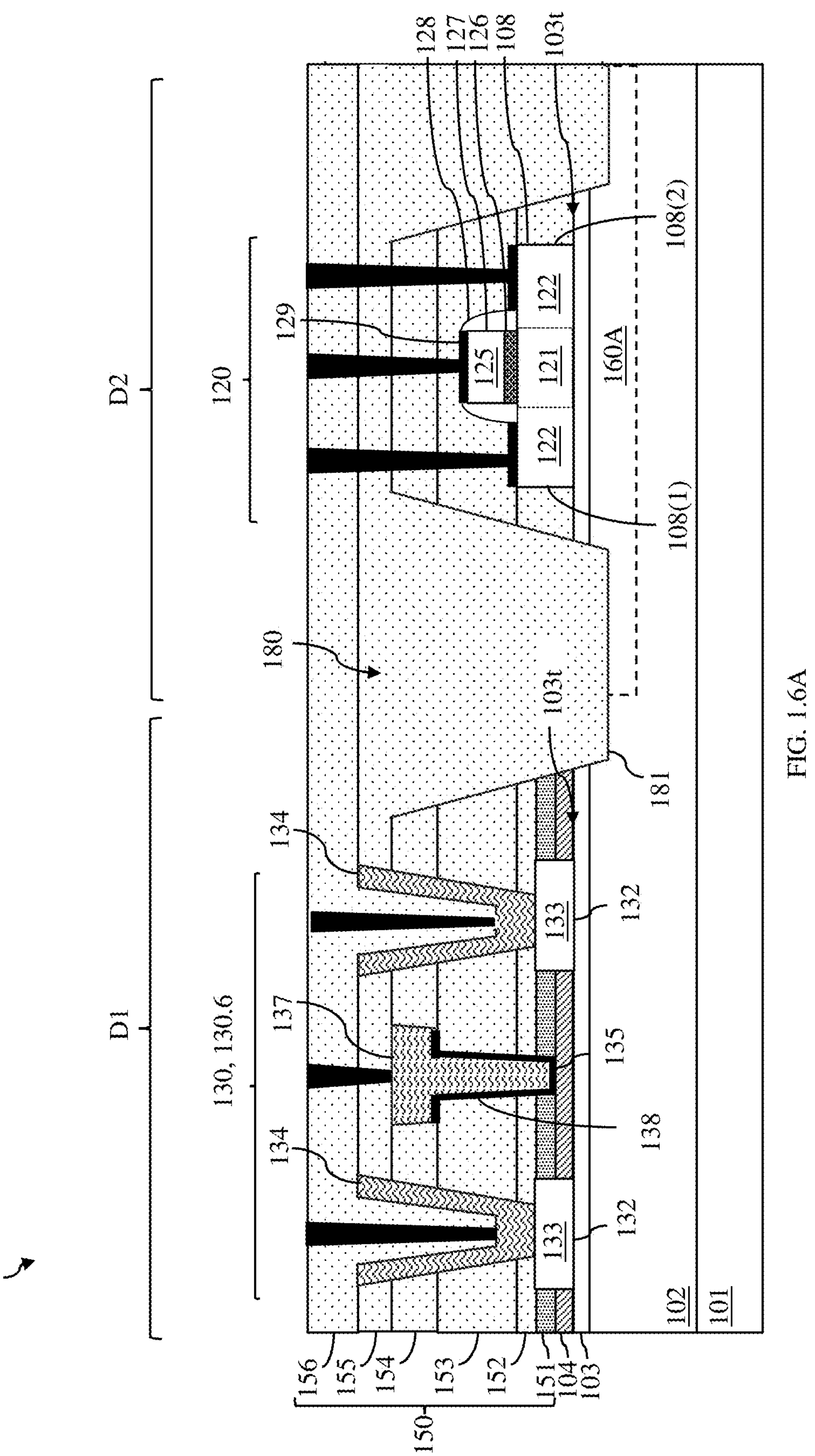
FIG. 1.6A

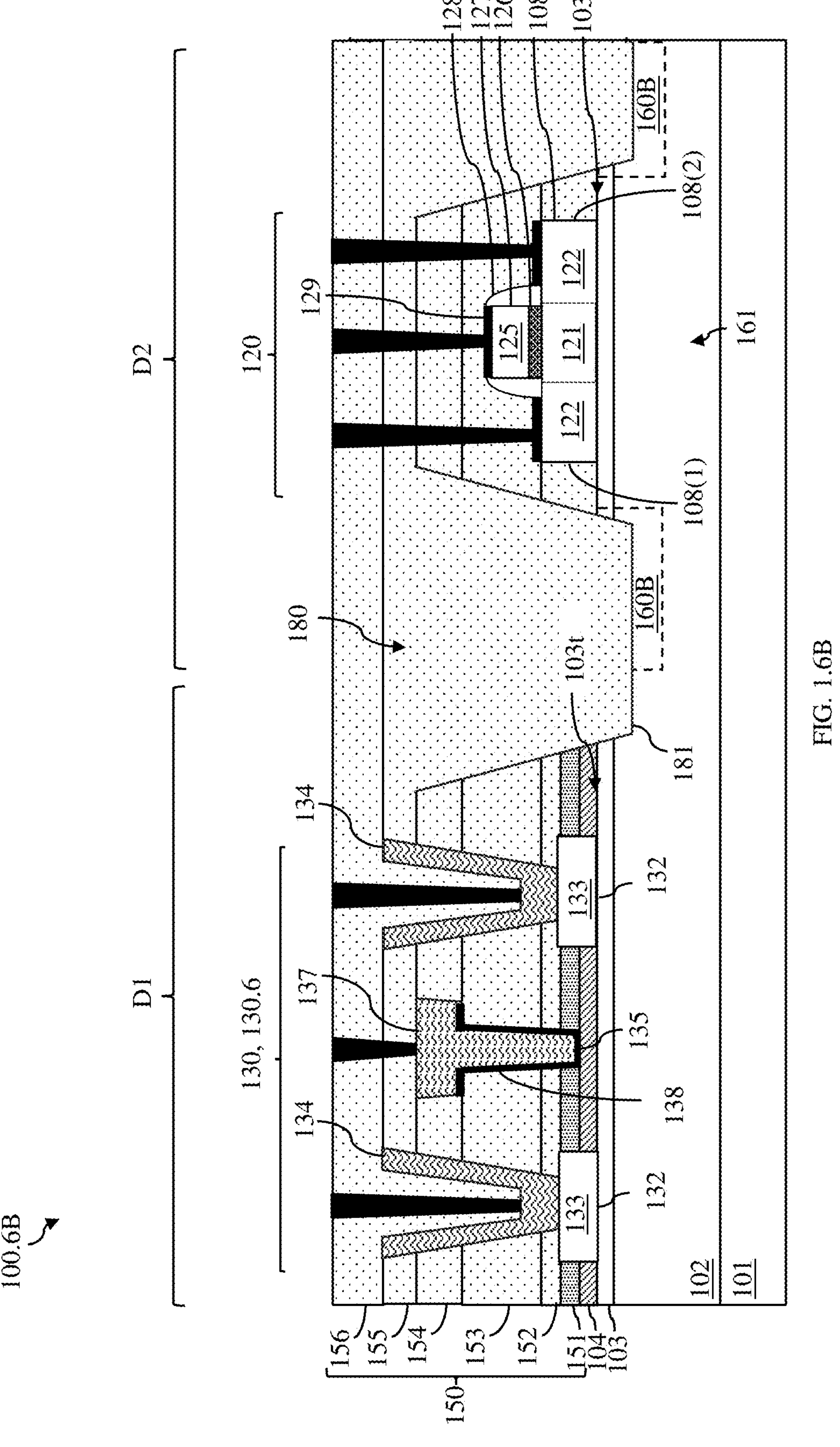
FIG. 1.6B

103t
D2
D1
160A
102
101
151
104
103

103t
D2
D1
160B
160B
102
101
151
104
103

CHIP INCLUDING SILICON DEVICE AND III-V SEMICONDUCTOR DEVICE ON III-V SEMICONDUCTOR LAYER

GOVERNMENT LICENSE RIGHTS

This invention was made with government support under contract HQ0727790700 awarded by the Defense Microelectronics Activity (DMEA). The government has certain rights in the invention.

BACKGROUND

The present disclosure relates to embodiments of an integrated circuit (IC) chip including a silicon device monolithically integrated with a III-V semiconductor device on a III-V semiconductor layer.

III-V semiconductor devices, such as high electron mobility transistors (HEMTs) and metal-insulator-semiconductor HEMTs (MISHEMTs), have emerged as a leading technology for radio frequency (RF) wireless applications, for low noise amplifiers, etc. due to their superior performance. However, these III-V semiconductor devices are limited in terms of on-chip logic capability due, for example, to a lack of enhancement-mode (E-mode) P-type III-V semiconductor devices. Therefore, in some applications, it could be beneficial to include silicon devices with III-V semiconductor devices on the same chip. However, since silicon devices are typically formed on the top surface of a bulk silicon substrate or on a silicon layer of a silicon-on-insulator (SOI) substrate and III-V semiconductor devices are typically formed on the top surface of a stack of epitaxial III-V semiconductor layers, silicon and III-V semiconductor devices are not readily integrated.

SUMMARY

Disclosed herein are embodiments of a semiconductor structure including a silicon device monolithically integrated with a III-V semiconductor device.

Some embodiments of the semiconductor structure can include a substrate and a stack of III-V semiconductor layers on the substrate particularly in both a first area and a second area. The structure can further include a III-V semiconductor device and a silicon device. The III-V semiconductor device can include a barrier layer above and immediately adjacent to a III-V semiconductor surface at the top of the stack in the first area. The silicon device can include a silicon-based layer above and immediately adjacent to the same III-V semiconductor surface at the top of the stack in the second area. Optionally, the structure can also include an isolation well within the stack in the second area. The isolation well can be adjacent to the III-V semiconductor surface, can be aligned below the silicon device, and can extend laterally beyond opposing ends of the silicon-based layer.

Other embodiments of a semiconductor structure can include a substrate and a stack of III-V semiconductor layers on the substrate particularly in both a first area and a second area. The structure can further include a III-V semiconductor device and a silicon device. The III-V semiconductor device can include a barrier layer above and immediately adjacent to a III-V semiconductor surface at the top of the stack in the first area. The silicon device can include a silicon-based layer above and immediately adjacent to the same III-V semiconductor surface at the top of the stack in the second area. The structure can also include an isolation well within the stack in the second area. In these embodiments, the isolation well can be adjacent the III-V semiconductor surface between the III-V semiconductor device and the silicon device.

Also disclosed herein are method embodiments for forming such semiconductor structures. For example, a disclosed method can include forming a stack of III-V semiconductor layers above a substrate in a first area and a second area. The top of this stack can include a III-V semiconductor surface. The method can further include forming a III-V semiconductor device and a silicon device on the stack. The III-V semiconductor device can be formed so as to include a barrier layer above and immediately adjacent to the III-V semiconductor surface at the top of the stack in the first area. The silicon device can be formed so as to include a silicon-based layer above and immediately adjacent to the III-V semiconductor surface at the top of the stack in the second area. Optionally, the method can include forming an isolation well within the stack in the second area. The isolation well can be formed so that it is adjacent to the III-V semiconductor surface and either: below the silicon device and extending laterally beyond opposing ends of the silicon-based layer or between the III-V semiconductor device and the silicon device.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIGS. 1.1A-1.6B are cross-section diagrams illustrating disclosed semiconductor structure embodiments, respectively;

DETAILED DESCRIPTION

Figure 2:
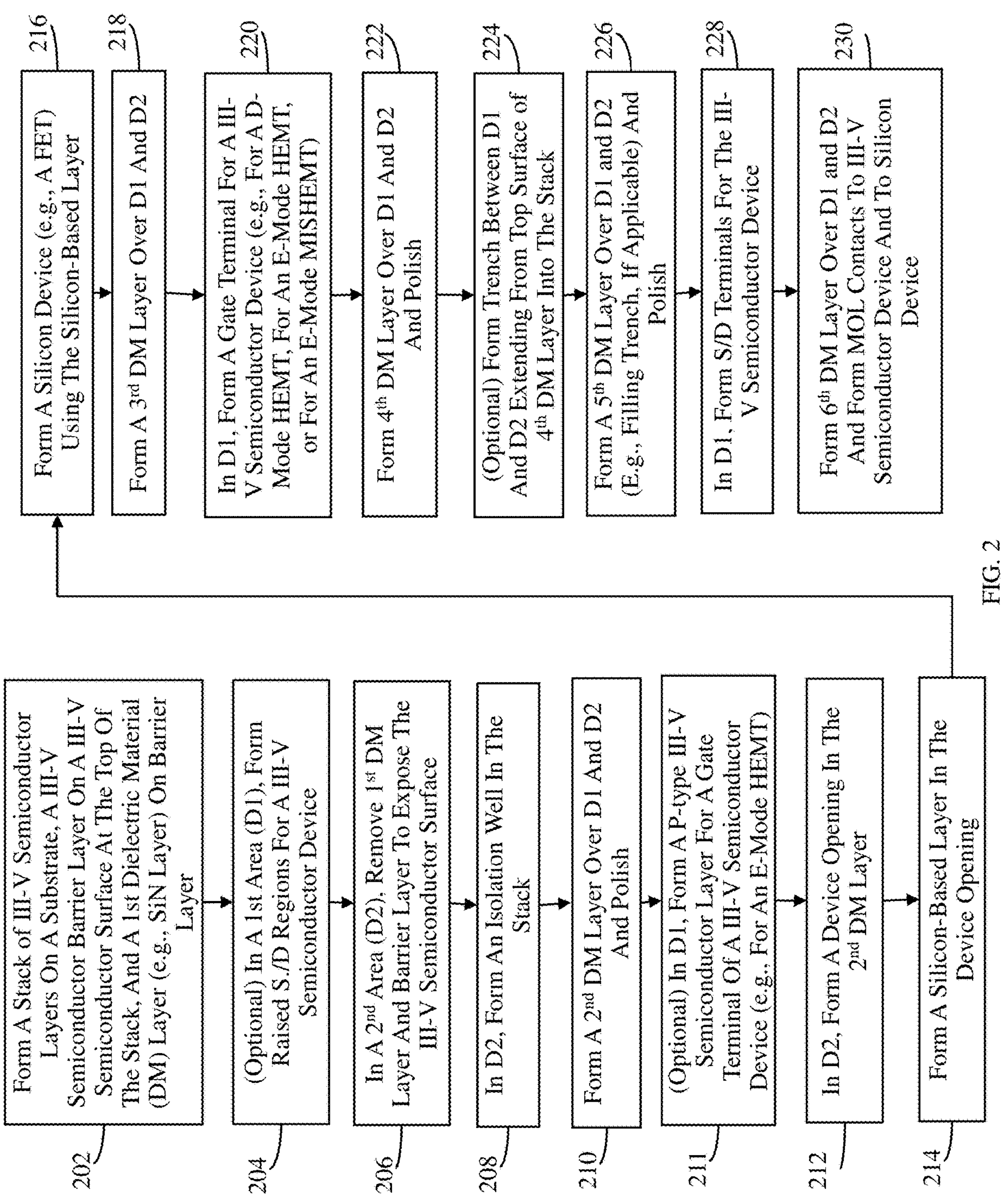
FIG. 2 is a flow diagram illustrating disclosed method embodiments.

As mentioned above, III-V semiconductor devices, such as high electron mobility transistors (HEMTs) and metal-insulator-semiconductor HEMTs (MISHEMTs), have emerged as a leading technology for radio frequency (RF) wireless applications, for low noise amplifiers, etc. due to their superior performance. However, these III-V semiconductor devices are limited in terms of on-chip logic capability due, for example, to a lack of an enhancement mode P-type III-V semiconductor devices. Therefore, in some applications, it could be beneficial to include silicon devices with III-V semiconductor devices on the same chip. However, since silicon devices are typically formed on the top surface of a bulk silicon substrate or on a silicon layer of a silicon-on-insulator (SOI) substrate and III-V semiconductor devices are typically formed on the top surface of a stack of epitaxial III-V semiconductor layers, silicon and III-V semiconductor devices are not readily integrated.

In view of the foregoing, disclosed herein are embodiments of a semiconductor structure including both a silicon device and a III-V semiconductor device on a III-V semiconductor surface of a stack of III-V semiconductor layers at essentially the same level above a substrate. More particularly, in the disclosed embodiments, the semiconductor structure can include a stack of III-V semiconductor layers. The semiconductor structure can include a silicon device (e.g., a field effect transistor (FET), etc.) and a III-V semiconductor device (e.g., a depletion-mode HEMT with or without raised III-V semiconductor source/drain regions, an enhancement-mode HEMT with or without raised III-V semiconductor source/drain regions, an enhancement-mode MISHEMT with or without raised III-V semiconductor source/drain regions, etc.).

The III-V semiconductor device can include, among other components, a barrier layer above and immediately adjacent to a III-V semiconductor surface at the top of the stack in a first area. The silicon device can include, among other components, a silicon-based layer above and immediately adjacent to the same III-V semiconductor surface in a second area. Thus, the barrier layer and the silicon-based layer are at the same level above the substrate. The semiconductor structure can also include an isolation well within the stack adjacent to the III-V semiconductor surface in the second area (e.g., to electrically isolate the III-V semiconductor device from the silicon device). The isolation well can include ions of an isolation species implanted into the stack so as to be: (a) aligned below and larger in area than the silicon device (e.g., extending laterally beyond opposing ends and sides of the silicon-based layer), or (b) between the III-V semiconductor device and the silicon device (e.g., laterally surrounding an undoped area aligned below the silicon device). Also disclosed herein are embodiments of a method of forming the semiconductor structure.

More particularly, FIG. 1.1A-1.6B are cross-section diagrams illustrating various embodiments of a semiconductor structure 100.1A-100.6B, respectively. Semiconductor structure 100.1A-100.6B can include a substrate 101. Substrate 101 can be, for example, a silicon substrate or a silicon-based substrate (e.g., a silicon carbide or silicon germanium substrate), a sapphire substrate, a III-V semiconductor substrate (e.g., a gallium nitride substrate or other suitable III-V semiconductor substrate) or any other substrate suitable for III-V semiconductor processing.

Semiconductor structure 100.1A-100.6B can further include a stack of III-V semiconductor layers on substrate 101 in both a first area (D1) (also referred to herein as a first device area or III-V semiconductor device area) and a second area (D2) (also referred to herein as a second device area or silicon device area). Those skilled in the art will recognize that a III-V semiconductor refers to a compound obtained by combining one or more group III elements, such as boron (B), aluminum (Al), gallium (Ga), or indium (In), with one or more group V elements, such as nitrogen (N), phosphorous (P), arsenic (As) or antimony (Sb)). Thus, examples of III-V semiconductors include, but are not limited to, gallium nitride, indium phosphide, gallium arsenide, aluminum gallium nitride, indium gallium nitride, etc. The III-V semiconductor layers of the stack can be epitaxially grown on substrate 101 and can include at least a buffer layer 102 and a channel layer 103 on the buffer layer 102. For example, a buffer layer 102 can be above and immediately adjacent to the top surface of substrate 101. Buffer layer 102 can be employed as an anchor to achieve nucleation and to duplicate orientation in subsequently grown epitaxial layers. Buffer layer 102 could be, for example, a gallium nitride layer and/or one or more layers of any other III-V semiconductor(s) suitable for use as a buffer layer for a HEMT or MISHEMT. Optionally, buffer layer 102 can be carbon-doped. Channel layer 103 can be above and immediately adjacent to the top surface of buffer layer 102. Channel layer 103 could be, for example, a gallium nitride layer and/or one or more layers of any other III-V semiconductor(s) suitable for use as a channel layer of a HEMT or MISHEMT. In any case, the top surface of the stack and, particularly, the top surface of channel layer 103 can be a III-V semiconductor surface 103*t*.

Semiconductor structure 100.1A-100.6B can further include a III-V semiconductor device 130 in D1 and a silicon device 120 in D2. III-V semiconductor device 130 can include, among other components discussed in greater detail below, a barrier layer 104 (and, particularly, another III-V semiconductor layer) that is above and immediately adjacent to III-V semiconductor surface 103*t*. Silicon device 120 can include, among other components discussed in greater detail below, a silicon-based layer 108 above and immediately adjacent to III-V semiconductor surface 103*t*. Thus, bottom surfaces of barrier layer 104 and silicon-based layer 108 are essentially co-planar and at the same level above the bottom surface of substrate 101 (i.e., barrier layer 104 and silicon-based layer 108 are separated from the bottom surface of substrate 101 by the same distance).

Semiconductor structure 100.1A-100.6B can further include multiple layers of dielectric material (DM) 150 (also referred to herein as DM layers) in D1 and D2 around and/or above various components of III-V semiconductor device 130 and silicon device 120. The DM layers can include a first DM layer 151 and, particularly, a silicon nitride layer. The DM layers can optionally include, but are not limited to, one or more of a second DM layer 152, a third DM layer 153, a fourth DM layer 154, a fifth DM layer 155, and a sixth DM layer 156. Any of the DM layers 152-156 can include a single layer of DM (e.g., a silicon dioxide layer or some other suitable DM) or two or more sub-layers of DM (e.g., a conformal silicon nitride layer and a silicon dioxide layer on the conformal silicon nitride layer or some other suitable combination of dielectric material layers).

D1 can include a III-V semiconductor device 130. III-V semiconductor device 130 can be a transistor that includes source/drain terminals 132, which are on channel layer 103, and a gate terminal 135, which is on barrier layer 104 and which is positioned laterally between source/drain terminals 132.

Specifically, III-V semiconductor device 130 can include a barrier layer 104 above and immediately adjacent to the III-V semiconductor surface 103*t* at the top of the stack. Barrier layer 104 can be yet another III-V semiconductor, which is different from channel layer 103 and which has a band gap that is wider than the bandgap of channel layer 103. Those skilled in the art will recognize that the channel and barrier III-V semiconductor materials can be selected so that a heterojunction is formed at the interface between the two layers, thereby resulting in the formation of a two-dimensional electron gas (2DEG) in channel layer 103. This 2DEG in channel layer 103 can provide the conductive pathway for the drifting of charges between source/drain terminals. Thus, for example, barrier layer 104 could be a layer of aluminum gallium nitride, aluminum nitride or any other III-V semiconductor material suitable for use as a barrier layer (e.g., depending upon the III-V semiconductor material of channel layer 103). In any case, the above-mentioned layers can be epitaxially grown by metal-organic chemical vapor deposition (MOCVD) or any other suitable technique (e.g., molecular beam epitaxy (MBE), hydride vapor phase epitaxy (HVPE), etc.). For purposes of illustration, the figures and the description above depict barrier layer 104 as including a single layer of III-V semiconductor material. However, it should be understood that the figures and description are not intended to be limiting and that, alternatively, barrier layer 104 could include two or more sub-layers of III-V semiconductor materials. First DM layer 151 (which as mentioned above can be a silicon nitride layer) can be above and immediately adjacent to the top surface of barrier layer 104.

In some embodiments, III-V semiconductor device 130 can be a HEMT (e.g., see III-V semiconductor device 130.1 of semiconductor structure 100.1A of FIG. 1.1A and semiconductor structure 100.1B of FIG. 1.1B; see III-V semiconductor device 130.2 of semiconductor structure 100.2A of FIG. 1.2A and semiconductor structure 100.2B of FIG. 1.2B; see III-V semiconductor device 130.3 of semiconductor structure 100.3A of FIG. 1.3A and semiconductor structure 100.3B of FIG. 1.3B; and see III-V semiconductor device 130.4 of semiconductor structure 100.4A of FIG. 1.4A and semiconductor structure 100.4B of FIG. 1.4B).

The HEMT can be a depletion-mode (D-mode) HEMT (e.g., see III-V semiconductor device 130.1 of semiconductor structure 100.1A of FIG. 1.1A and semiconductor structure 100.1B of FIG. 1.1B; and see III-V semiconductor device 130.2 of semiconductor structure 100.2A of FIG. 1.2A and semiconductor structure 100.2B of FIG. 1.2B). Those skilled in the art will recognize that a D-mode HEMT refers to a HEMT that is in a normally on-state (i.e., that is normally conductive) and that requires a voltage applied to gate terminal 135 to switch to an off-state (i.e., to become non-conductive). In such D-mode HEMTs, a gate opening can extend vertically through DM layers (e.g., third DM layer 153, second DM layer 152, and first DM layer 151) to barrier layer 104. Gate conductor material 137 can fill this gate opening. Optionally, gate conductor material 137 can overfill the gate opening. For example, optionally, gate conductor material 137 can include a lower portion filling the gate opening and an upper portion above and wider than the lower portion (e.g., so that gate terminal 135 is essentially T-shaped). In these D-mode HEMTs (e.g., 130.1 and 130.2), gate conductor material 137 can include metallic gate conductor material(s) (i.e., metal or metal alloy gate conductor material(s)) above and immediately adjacent to the top surface of barrier layer 104 so that gate terminal 135 is a Schottky contact gate terminal, which will control a two-dimensional electron gas (2DEG) in channel layer 103 thereunder. Example metallic gate conductor materials suitable for creating a Schottky contact gate terminal include, but are not limited to, aluminum, gold, titanium, titanium nitride, nickel/gold, or titanium/platinum/gold.

Alternatively, the HEMT can be an enhancement-mode (E-mode) HEMT (e.g., see III-V semiconductor device 130.3 of semiconductor structure 100.3A of FIG. 1.3A and semiconductor structure 100.3B of FIG. 1.3B; and see III-V semiconductor device 130.4 of semiconductor structure 100.4A of FIG. 1.4A and semiconductor structure 100.4B of FIG. 1.4B). Those skilled in the art will recognize that an E-mode HEMT refers to a HEMT that is normally off (i.e., that is normally non-conductive) and that requires a voltage applied to gate terminal 135 to switch to an on-state (i.e., to become conductive). The E-mode HEMT is similar in structure to the D-mode HEMT described above, except that it includes a P-type III-V semiconductor layer 136 in gate terminal 135 stacked between barrier layer 104 and gate conductor material 137. P-type III-V semiconductor layer 136 can be, for example, a III-V semiconductor (such as gallium nitride), which is epitaxially grown on barrier layer 104 and which is doped (e.g., with magnesium) so as to have P-type conductivity. In these E-mode HEMTs (e.g., 130.3 and 130.4) as in the D-mode HEMTs, gate conductor material 137 can include metallic gate conductor material(s) so that gate terminal 135 is a Schottky contact gate terminal, as discussed in detail above with regard to the structures.

In other embodiments, III-V semiconductor device 130 can be a MISHEMT and, particularly, an E-mode MISHEMT (e.g., see III-V semiconductor device 130.5 of semiconductor structure 100.5A of FIG. 1.5A and semiconductor structure 100.5B of FIG. 1.5B; see III-V semiconductor device 130.6 of semiconductor structure 100.6A of FIG. 1.6A and semiconductor structure 100.6B of FIG. 1.6B). In an E-mode MISHEMT, gate terminal 135 can include a gate opening that extends vertically through DM layers (e.g., third DM layer 153, second DM layer 152, and first DM layer 151) to barrier layer 104. A gate dielectric layer 138 can line the gate opening and, optionally, can extend laterally onto the dielectric surface at the top edge of the gate opening. Gate dielectric layer 138 can be a dielectric material with a relatively high dielectric constant (K) (e.g., K is greater than the 3.9 dielectric constant of silicon dioxide). This high-K dielectric material could be, for example, aluminum oxide, tantalum oxide, zirconium oxide, a hafnium (Hf)-based dielectric material (e.g., hafnium oxide, hafnium silicon oxide, hafnium silicon oxynitride, hafnium aluminum oxide, etc.) or some other suitable high-K dielectric material.

Alternatively, gate dielectric layer 138 could be, for example, a silicon dioxide ($SiO_2$) layer or a layer of any other dielectric material suitable for use as a gate dielectric layer of a MISHEMT. Gate conductor material 137 can fill the remaining space within the gate opening. Optionally, gate conductor material 137 can overfill the gate opening. For example, optionally, gate conductor material 137 can include a lower portion filling the gate opening and an upper portion above and wider than the lower portion (e.g., so that gate terminal 135 is essentially T-shaped). In these E-mode MISHEMTs 130.5-130.6, the gate dielectric layer 138 separates the gate conductor material 137 from barrier layer 104. Thus, a Schottky contact gate terminal is not required and gate conductor material 137 could include one or more layers of any suitable gate conductor material (e.g., gate metal(s), gate metal alloy(s), doped polysilicon, etc.).

Regardless of whether the III-V semiconductor device is a D-mode HEMT 130.1-130.2 (e.g., FIG. 1.1A-1.2B), an E-mode HEMT 130.3-130.4 (e.g., 1.3A-1.4B), or an E-mode MISHEMT 130.5-130.6 (FIG. 1.5A-1.6B), fourth DM layer 154 can be stacked on third DM layer 153 (e.g., laterally surrounding the upper portion of gate conductor material 137 of gate terminal 135). Fifth DM layer 155 can be stacked on fourth DM layer 154 and can further extend laterally over gate terminal 135.

Additionally, in each of these III-V semiconductor devices 130, conventional source/drain terminals or source/drain terminals with raised III-V semiconductor source/drain regions can be on channel layer 103 embedded with DM layers. For example, in some embodiments (e.g., see III-V semiconductor device 130.1 of semiconductor structure 100.1A of FIG. 1.1A and semiconductor structure 100.1B of FIG. 1.1B; see III-V semiconductor device 130.3 of semiconductor structure 100.3A of FIG. 1.3A and semiconductor structure 100.3B of FIG. 1.3B; and see III-V semiconductor device 130.5 of semiconductor structure 100.5A of FIG. 1.5A and semiconductor structure 100.5B of FIG. 1.5B), source/drain terminals 132 can include: source/drain openings, which extend through multiple DM layers (e.g., fifth DM layer 155 down through first DM layer 151) and barrier layer 104 to channel layer 103; and metallic source/drain layers 134 within (e.g., at least lining and optionally filling) the source/drain openings, respectively, so as to be above and immediately adjacent to channel layer 103. In other embodiments (e.g., see III-V semiconductor device 130.2 of semiconductor structure 100.2A of FIG. 1.2A and semiconductor structure 100.2B of FIG. 1.2B; see III-V semiconductor device 130.4 of semiconductor structure 100.4A of FIG. 1.4A and semiconductor structure 100.4B of FIG. 1.4B; and see III-V semiconductor device 130.6 of semiconductor structure 100.6A of FIG. 1.6A and semiconductor structure 100.6B of FIG. 1.6B), source/drain terminals 132 can include: lower source/drain openings, which extend, for example, through first DM layer 151 and barrier layer 104 to channel layer 103; and raised III-V semiconductor source/drain regions 133 within the lower source/drain openings so as to be above and immediately adjacent to channel layer 103. Raised III-V semiconductor source/drain regions 133 can include, for example, a III-V semiconductor epitaxially grown within the lower source/drain openings. This III-V semiconductor can be, for example, indium gallium nitride layers or any other suitable III-V semiconductor material. Source/drain terminals 132 can further include: upper source/drain openings, which extend through additional DM layers (e.g., through fifth DM layer 155 down through second DM layer 152) to raised III-V semiconductor source/drain regions 133; and metallic source/drain layers 134 within (e.g., at least lining and optionally filling) the upper source/drain openings, respectively, so as to be above and immediately adjacent to raised III-V semiconductor source/drain regions 133. In any case, metallic source/drain layers 134 of source/drain terminals 132 should include one or more metal or metal alloy layers suitable for creating ohmic contacts at the metal-semiconductor junctions. Such metallic source/drain layers 134 could include, for example, titanium/aluminum/titanium nitride, titanium/aluminum/titanium/gold, or molybdenum/aluminum/molybdenum/gold. Sixth DM layer 156 could be stacked on fifth DM layer 155 over source/drain terminals 132. It should be noted that, if metallic source/drain layer 134 only lines the source/drain openings, sixth DM layer 156 can also fill remaining space within the source/drain openings. The top surface of sixth DM layer 156 can be polished so that it is essentially planar.

D2 can include a silicon device 120. It should be noted that, during processing, first DM layer 151 along with barrier layer 104 can be removed from D2. Thus, in D2, second DM layer 152 is above and immediately adjacent to III-V semiconductor surface 103*t*. A device opening can extend through second DM layer 152 to III-V semiconductor surface 103*t*. Silicon device 120 can include a silicon-based layer 108, which has been epitaxially grown on III-V semiconductor surface 103*t* within device opening. For purposes of this disclosure, a silicon-based layer refers to a layer of silicon, a layer of doped silicon (e.g., carbon-doped silicon, etc.), or a layer of a silicon compound with semiconductor properties (e.g., silicon germanium, etc.). Furthermore, silicon-based layer 108 can include only a single layer of silicon-based material or, alternatively, two or more sub-layers of silicon-based materials. In any case, silicon-based layer 108 may be monocrystalline in structure. Alternatively, given the lattice mismatch between the crystalline structures of at the III-V semiconductor surface 103*t*, silicon-based layer 108 could be essentially monocrystalline crystalline in structure with some crystalline defects or essentially polycrystalline in structure.

Silicon device 120 can be any type of silicon device that can include a silicon-based layer 108. For example, silicon device 120 can be a planar field effect transistor (FET), such as a P-type field effect transistor (PFET) or an N-type field effect transistor (NFET). Specifically, the FET can include, within silicon-based layer 108, channel region 121 positioned laterally between source/drain regions 122. Channel region 121 can have a first type conductivity at a relatively low conductivity level and source/drain regions 122 can have a second type conductivity that is different from the first type conductivity and at a relatively high conductivity level. Those skilled in the art will recognize that, for a PFET, the first type conductivity can be N-type and the second type conductivity can be P-type, whereas, for an NFET, the first type conductivity can be P-type and the second type conductivity can be N-type. That is, for a PFET, channel region 121 can have N-conductivity and source/drain regions 122 can have P+ conductivity. Contrarily, for a NFET, channel region 121 can have P− conductivity and source/drain regions can have N+ conductivity. The FET can further include a gate structure 125 on silicon-based layer 108 adjacent to channel region 121. Gate structure 125 can include, for example, a gate dielectric layer 126 (including one or more layers of gate dielectric material) and a gate conductor layer 127 (including one or more layers of gate conductor material) on gate dielectric layer 126. The FET can further include gate sidewall spacers 128 on silicon-based layer 108 positioned laterally adjacent to opposing sidewalls of gate structure 125. Optionally, the FET can further include metal silicide layers 129 on the top surface of silicon-based layer 108 adjacent to source/drain regions 122 and further on the top surface of a layer of polysilicon gate conductor material (if included as the uppermost layer in gate structure 125). The above-described components of a planar FET are well known in the art. Thus, more specific details thereof have been omitted from the specification in order to allow the reader to focus on the salient aspects of the disclosed embodiments (e.g., related to monolithic integration of silicon and III-V semiconductor devices on the same chip).

It should be understood that the above-described planar FET is just one example of a silicon device 120 that could be incorporated into semiconductor structure 100.1A-100.6B. Alternatively, silicon device 120 could be a FET with additional components and/or a different configuration. For example, silicon device 120 could be FET with source/drain extensions, a FET with halos, and/or an asymmetric FET (e.g., a laterally diffused metal-oxide semiconductor (LDMOS) FET). Alternatively, silicon device 120 could be any other type of silicon device that includes a silicon-based layer (e.g., a resistor, a PN diode, a lateral bipolar junction transistor (BJT), etc.).

D2 can further include an isolation well 160A (e.g., see semiconductor structure 100.1A of FIG. 1.1A, 100.2A of FIG. 1.2A, 100.3A of FIG. 1.3A, 100.4A of FIG. 1.4A, 100.5A of FIG. 1.5A and 100.6A of FIG. 1.6A) or an isolation well 160B (e.g., see semiconductor structure 100.1B of FIG. 1.1B, 100.2B of FIG. 1.2B, 100.3B of FIG. 1.3B, 100.4B of FIG. 1.4B, 100.5B of FIG. 1.5B and 100.6B of FIG. 1.6B). Isolation well 160A or 160B can be within the stack of III-V semiconductor layers adjacent to III-V semiconductor surface 103*t*. As discussed in greater detail below, isolation wells 160A and 160B simply differ as to their placement within the stack of III-V semiconductor layers relative to silicon device 120. For purposes of this disclosure, an isolation well refers to a region of semiconductor material implanted with ions of a dopant species, which is specifically selected to impart isolation properties to the region. Examples of ions that could be implanted into a III-V semiconductor materials (e.g., gallium nitride, aluminum gallium nitride, etc.) to form isolation well 160A or 160B include, but are not limited to, nitrogen, argon, hydrogen, helium, or oxygen. Isolation well 160A can be adjacent to III-V semiconductor surface 103*t* (e.g., extending through channel layer 103 and into buffer layer 102 below), can be aligned below silicon device 120, and can be larger in area than silicon device 120. For example, isolation well 160A can be below silicon-based layer 108 and can extend laterally beyond boundaries thereof (e.g., beyond opposing ends 108(1) and 108(2) of silicon-based layer 108, as illustrated, and further beyond opposing sides (not shown)).

Isolation well 160B can be adjacent to III-V semiconductor surface 103*t* (e.g., extending through channel layer 103 and into buffer layer 102 below) and can at least be positioned laterally between III-V semiconductor device 130 and silicon device 120. In some embodiments, isolation well 160B does not extend under silicon-based layer 108. That is, an undoped region 161 can be below silicon-based layer 108 and the isolation well can be completely offset from silicon-based layer 108, as shown. In other embodiments, an undoped region can be below silicon-based layer 108, but the isolation well can extend partially under ends and/or sides of silicon-based layer 108 (not shown). In still other embodiments, an undoped region can be below silicon-based layer 108 and the isolation well can completely laterally surround this undoped region so that it is either completely offset from silicon-based layer 108 or so that it extends partially under ends and/or sides of silicon-based layer 108.

Semiconductor structure 100.1A-100.6B can further include various middle of the line (MOL) contacts. For example, in D1, MOL contacts can extend from the top surface of sixth DM layer 156 down to the III-V semiconductor device 130 (e.g., to gate terminal 135 and to source/drain terminals 132). In D2, MOL contacts can extend from the top surface of sixth DM layer 156 down to silicon device 120 (e.g., to gate structure 125 and source/drain regions 122).

Optionally, semiconductor structure 100.1A-100.6B can further include a trench isolation region 180 between D1 and D2. In some embodiments, trench isolation region 180 can laterally surrounded D2 or a portion thereof (e.g., silicon device 120 within D2). Trench isolation region 180 can include, for example, a trench 181 that extends, for example, from a top surface of fourth DM layer 154 down into the stack of III-V semiconductor layers and, optionally, completely through channel layer 103 and into buffer layer 102. Fifth DM layer 155 can be on a top surface of fourth DM layer 154 and can further fill trench 181. For example, fifth DM layer 155 could include, for example, a conformal silicon nitride layer that covers fourth DM layer 154 and lines trench 181 and a blanket silicon dioxide layer on the silicon nitride layer. The blanket silicon dioxide layer can be relatively thick so as to fill the trench and can further be polished during processing so as to have an essentially planar top surface. Such a trench isolation region 180 provides increased isolation between III-V semiconductor device 130 and silicon device 120 as compared to embodiments that include isolation well 160A or 160B alone.

FIG. 2 is a flow diagram illustrating method embodiments for forming semiconductor structures, such as semiconductor structures 100.1A-100.6B described above and illustrated in FIG. 1.1A-1.6B. Generally, these method embodiments can include: forming a stack of III-V semiconductor layers on a substrate; and forming a III-V semiconductor device on the stack in a first device area (D1) (also referred to herein as a first area or a III-V semiconductor device area) and a silicon device on the stack in a second device area (D2) (also referred to herein as a second area or silicon device area). The III-V semiconductor device can be formed so that it includes, amongst other components, a barrier layer above and immediately adjacent to a III-V semiconductor surface at the top of the stack in D1. The silicon device can be formed so that it includes, amongst other components, a silicon-based layer above and immediately adjacent to the same III-V semiconductor surface at the top of the stack in D2.

Figures 3, 4:
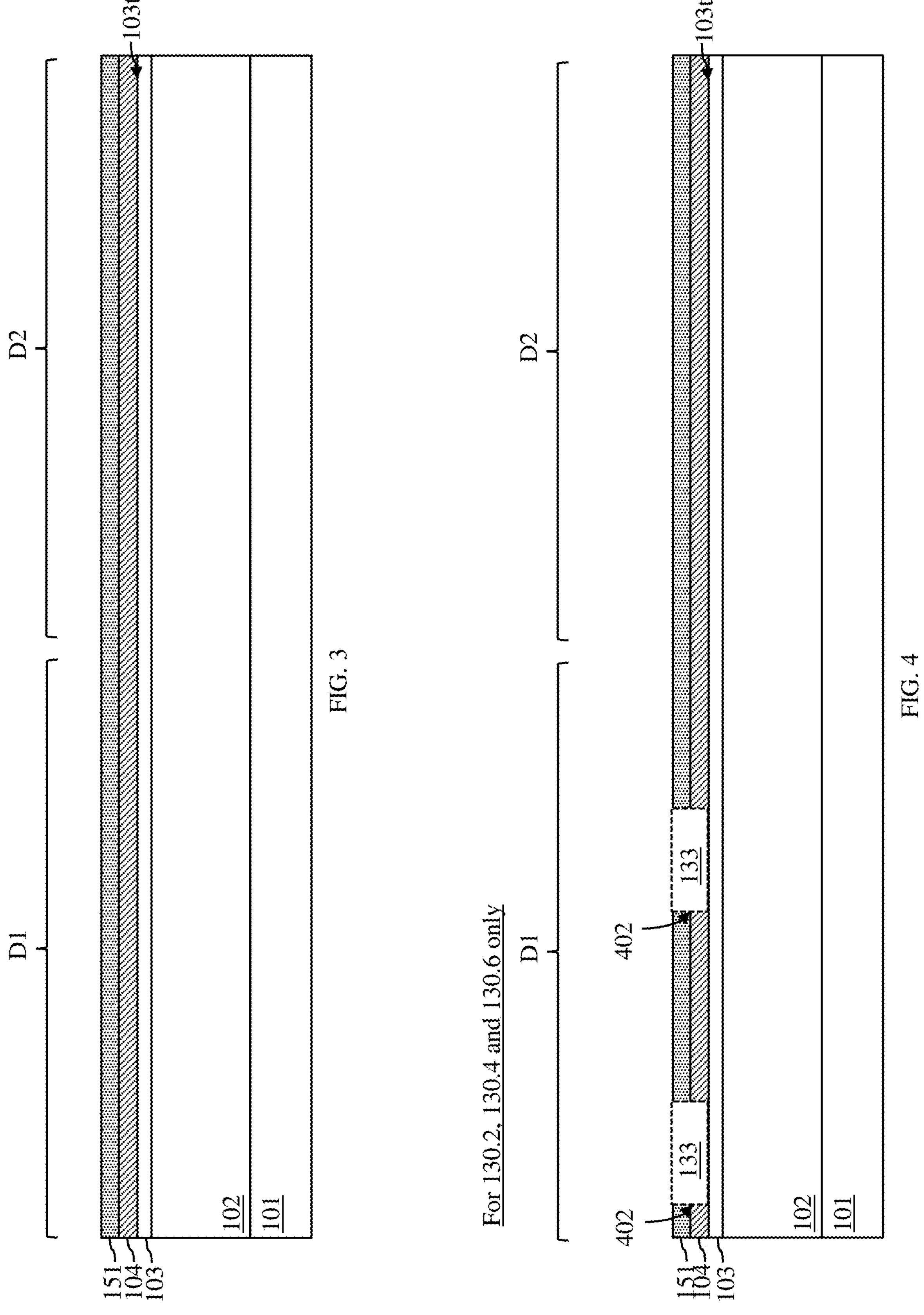
FIGS. 3-15 are cross-section diagrams illustrating partially completed semiconductor structures formed according to the flow diagram of FIG. 2.

More specifically, referring to the flow diagram of FIG. 2, the method embodiments can include providing a substrate 101 and forming a stack of III-V semiconductor layers on substrate 101 (see process 202 and FIG. 3). Substrate 101 can be, for example, a silicon substrate or a silicon-based substrate (e.g., a silicon carbide or silicon germanium substrate), a sapphire substrate, a III-V semiconductor substrate (e.g., a gallium nitride substrate or other suitable III-V semiconductor substrate) or any other substrate suitable for III-V semiconductor processing. The III-V semiconductor layers in the stack can include a buffer layer 102 and a channel layer 103 epitaxially grown on substrate 101. Buffer layer 102 can be employed as an anchor to achieve nucleation and to duplicate orientation in subsequently grown epitaxial layers and can include, for example, a gallium nitride layer and/or one or more layers of any other III-V semiconductor(s) suitable for use as a buffer layer for a HEMT or MISHEMT. Optionally, buffer layer 102 can be carbon-doped. Channel layer 103 can be epitaxially grown above and immediately adjacent to the top surface of buffer layer 102 and can be, for example, a gallium nitride layer and/or one or more layers of any other III-V semiconductor(s) suitable for use as a channel layer of a HEMT or MISHEMT. In any case, the top surface of the stack and, particularly, the top surface of channel layer 103 can be a III-V semiconductor surface 103*t*.

The method embodiments can further include forming (e.g., epitaxially growing) a barrier layer 104 on channel layer 103 (see FIG. 3). Barrier layer 104 could be a layer of aluminum gallium nitride, aluminum nitride or any other III-V semiconductor material suitable for use as a barrier layer (e.g., depending upon the III-V semiconductor material of channel layer 103). The method embodiments can further include forming a first DM layer 151 on the barrier layer 104 (see FIG. 3). First DM layer 151 could be a relatively thin silicon nitride layer and could be formed, for example, by chemical vapor deposition (CVD) or any other process suitable for depositing a thin film of silicon nitride layer.

Optionally, for III-V semiconductor devices 130.2 (as shown in FIG. 1.2A or 1.2B), 130.4 (as shown in FIG. 1.4A or 1.4B), and/or 130.6 (as shown in FIG. 1.6A or 1.6B), raised III-V semiconductor source/drain regions 133 can be formed in D1 (see process 204 and FIG. 4). For example, a pair of lower source/drain openings 402, which extend through first DM layer 151 and barrier layer 104 to channel layer 103, can be formed (e.g., by conventional lithographic patterning and etch techniques) at desired locations in D1. Then, III-V semiconductor material can be epitaxially grown on exposed portions of the III-V semiconductor surface 103*t* at the bottoms of these lower source/drain openings 402, thereby forming the raised III-V semiconductor source/drain regions 133. The III-V semiconductor material for these raised III-V semiconductor source/drain regions 133 can be, for example, indium gallium nitride layers or any other suitable III-V semiconductor material. For purposes of illustration, additional processes are illustrated in the figures with respect to formation of a III-V semiconductor device that does not include such raised III-V semiconductor source/drain regions. However, it should be understood that essentially the same processes can be performed during formation of a III-V semiconductor device that does include such raised III-V semiconductor source/drain regions 133.

Figure 5:
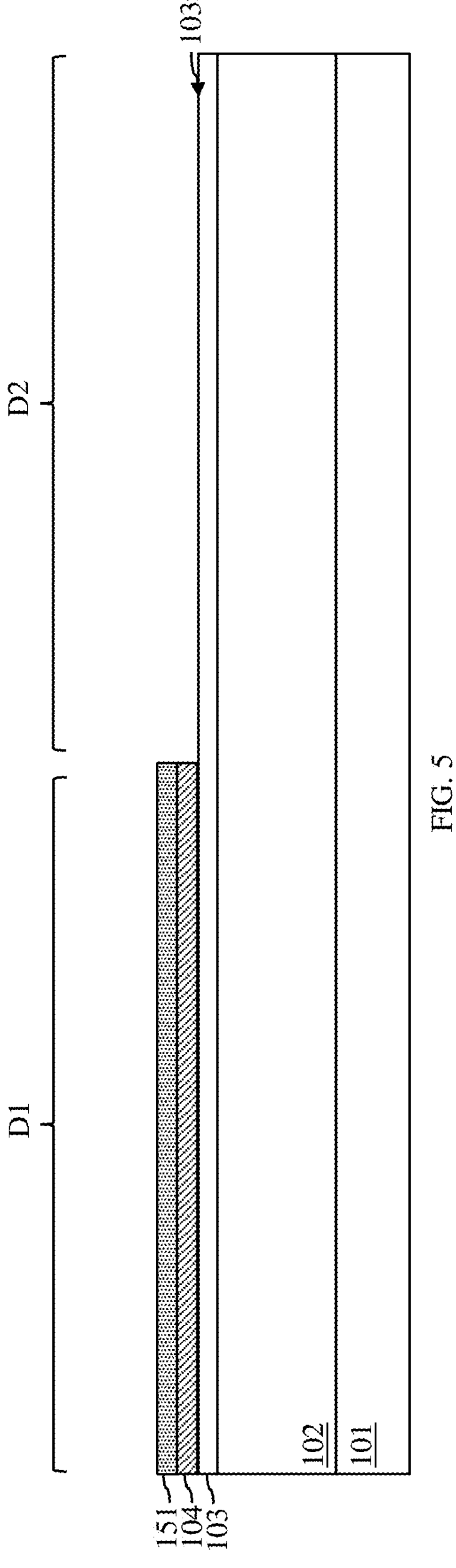

First DM layer 151 and barrier layer 104 can be removed from at least a portion of D2 (e.g., using conventional lithographic patterning and etch processes) to expose the III-V semiconductor surface 103*t* at the top of the stack of III-V semiconductor layers (see process 206 and FIG. 5). It should be noted that formation of raised III-V semiconductor source/drain regions 133 for III-V semiconductor device 130.2, 130.4 or 130.6 can be performed either before removal of first DM layer 151 and barrier layer 104 from D2 (as illustrated) or, alternatively, after removal of the two layers.

Figures 6A, 6B:
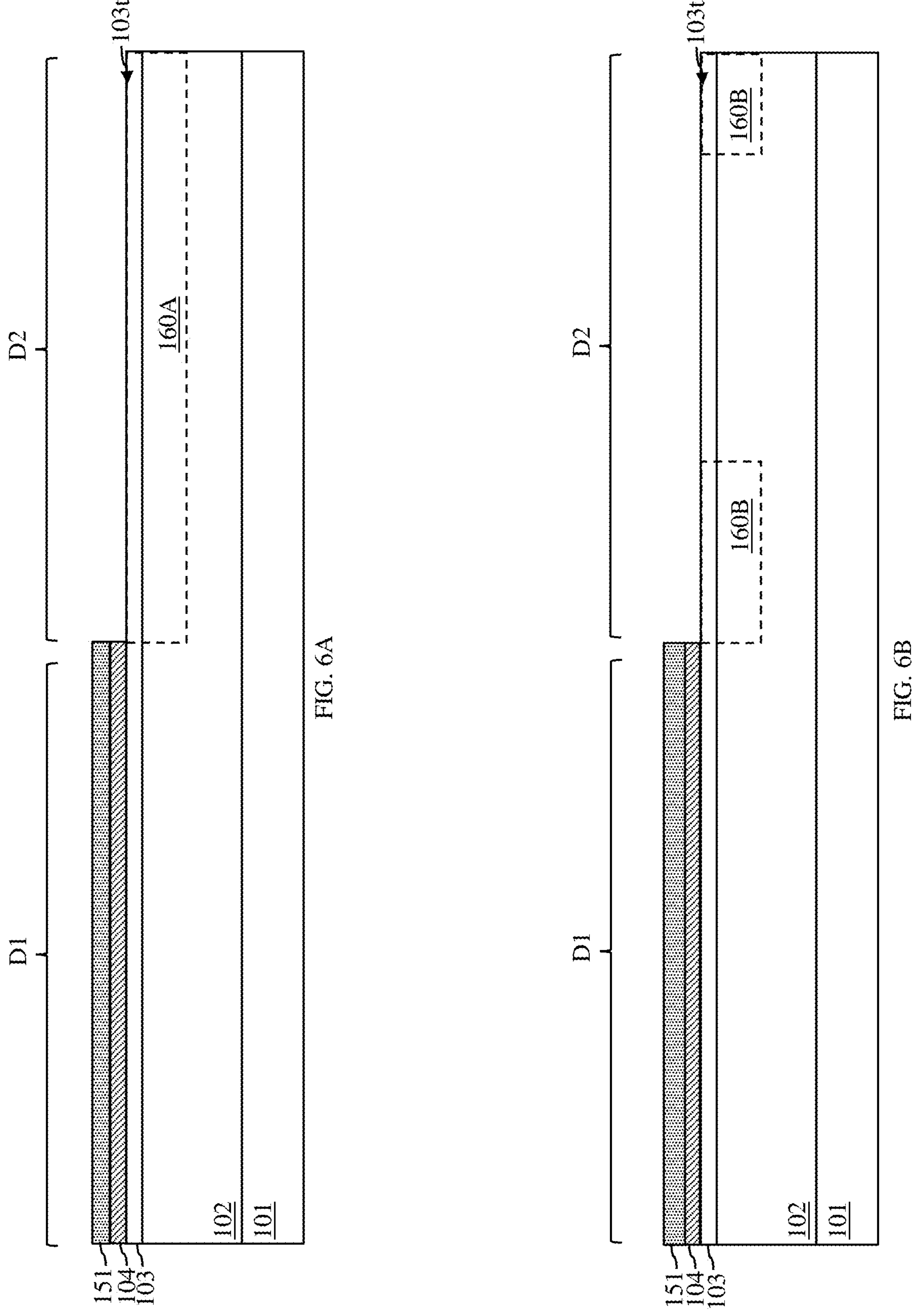

An isolation well 160A or 160B can be formed in the stack of III-V semiconductor layers in D2 (see process 208 and FIG. 6A or 6B). For example, a mask layer could be formed over the partially completed structure and lithographically patterned and etched to form opening(s) exposing the III-V semiconductor surface 103*t* at desired locations (s) for the isolation well within D2. These locations are discussed in detail above with regard to the structure embodiments. Next, the exposed III-V semiconductor material can be implanted with ions of a dopant species that is specifically selected to impart isolation properties. Examples of ions that could be implanted into a III-V semiconductor materials (e.g., gallium nitride, aluminum gallium nitride, etc.) to form an isolation well include, but are not limited to, nitrogen, argon, hydrogen, helium, or oxygen.

Figure 7:
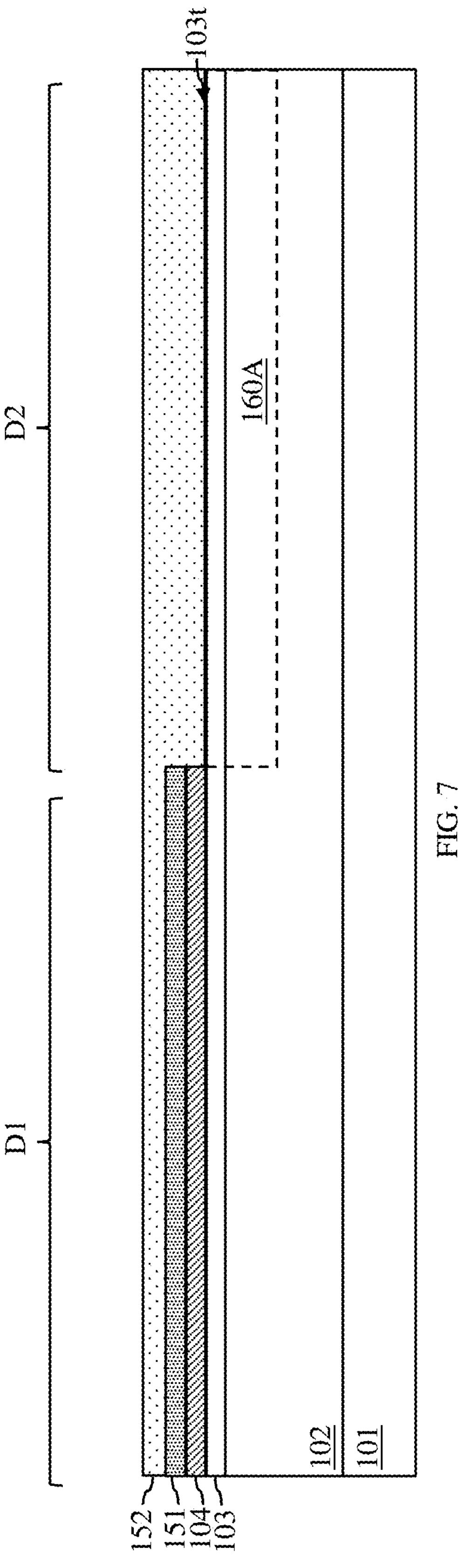

A second DM layer 152 can be formed (e.g., by CVD or other suitable deposition technique) over the partially completed structure (see process 210 and FIG. 7). Second DM layer 152 can include, for example, an optional silicon nitride layer that covers first DM layer 151 in D1 and III-V semiconductor surface 103*t* in D2 and a silicon dioxide layer on the silicon nitride layer. Alternatively, second DM layer 152 can include one or more layers of any other suitable DM. A polishing processes (e.g., a conventional chemical mechanical polishing (CMP) process) can be performed so that the top surface of second DM layer 152 is essentially planar across D1 and D2.

Figures 8, 9:
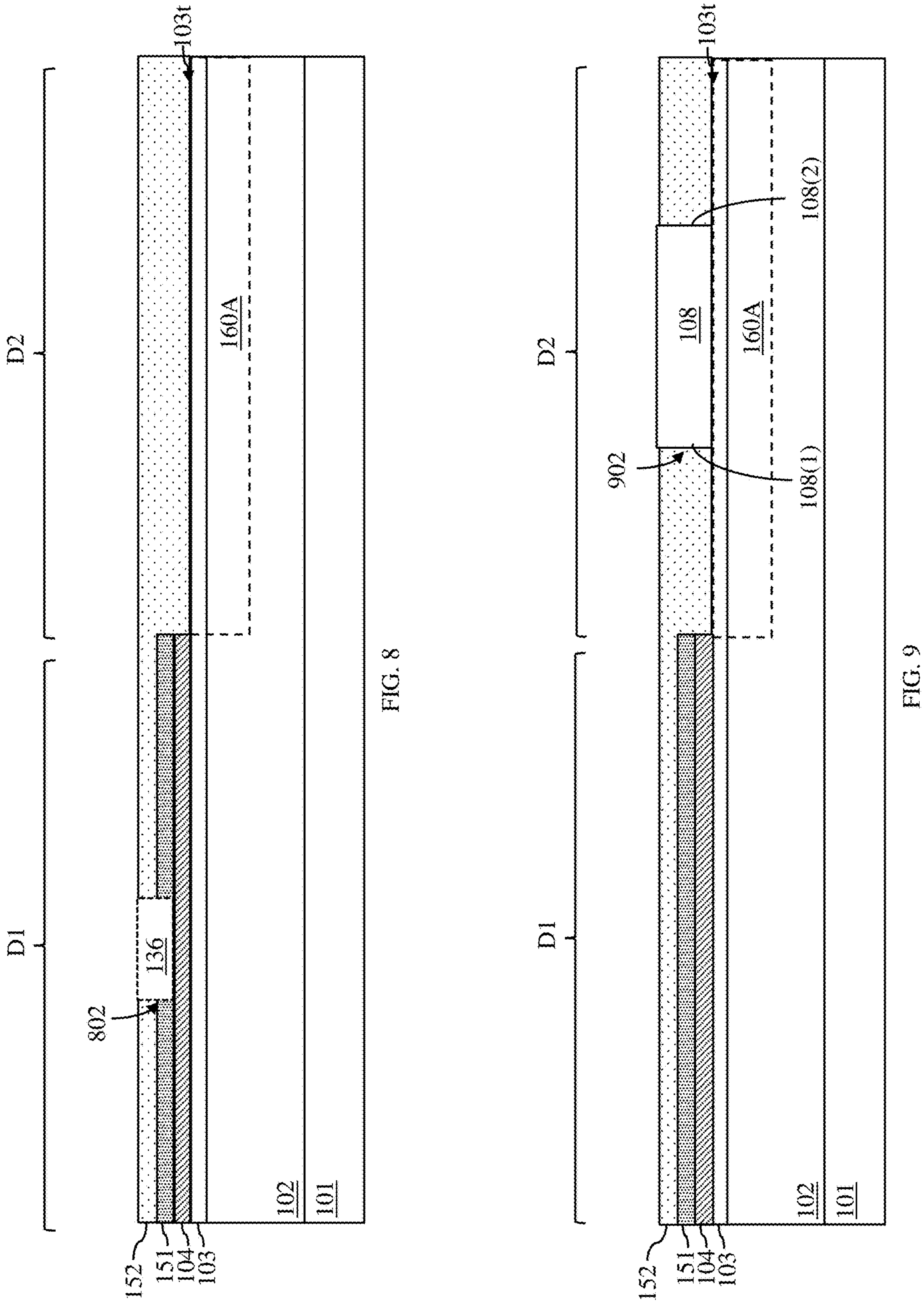

Optionally, for E-mode HEMT-type III-V semiconductor devices 130.3 (as shown in FIG. 1.3A or 1.3B) or 130.4 (as shown in FIG. 1.4A or 1.4B), a P-type III-V semiconductor layer 136 for a gate terminal can be formed in D1 (see process 211 and FIG. 8). For example, an opening 802, which extends through second DM layer 152 to barrier layer 104, can be formed (e.g., by conventional lithographic patterning and etch techniques) at a desired location for the gate terminal in D1. Then, a III-V semiconductor material layer (e.g., gallium nitride) can be epitaxially grown on barrier layer 104 at the bottom of the opening 802. This layer can be either in situ-doped or subsequently implanted with a P-type dopant (e.g., magnesium) to form the P-type III-V semiconductor layer 136. For purposes of illustration, additional processes are illustrated in the figures with respect to formation of a III-V semiconductor device that does not include a P-type III-V semiconductor layer in the gate terminal. However, it should be understood that essentially the same processes can be performed during formation of a III-V semiconductor device that does include such a layer.

In any case, a device opening 902 can be formed (e.g., using conventional lithographic patterning and etch processes) in second DM layer 152 within D2 in order to expose III-V semiconductor surface 103*t* (see process 212 and FIG. 9). Then, a silicon-based layer 108 can be formed (e.g., epitaxially grown) within the device opening 902 on III-V semiconductor surface 103*t* (see process 214 and FIG. 9). Silicon-based layer 108 can be an epitaxial layer of silicon, doped silicon (e.g., carbon-doped silicon, etc.), or a silicon compound, such as silicon germanium. Silicon-based layer 108 may be monocrystalline in structure. Alternatively, given the lattice mismatch between the crystalline structures of at the III-V semiconductor surface 103*t*, silicon-based layer 108 could be essentially monocrystalline crystalline in structure with some crystalline defects or essentially polycrystalline in structure.

Figure 10:
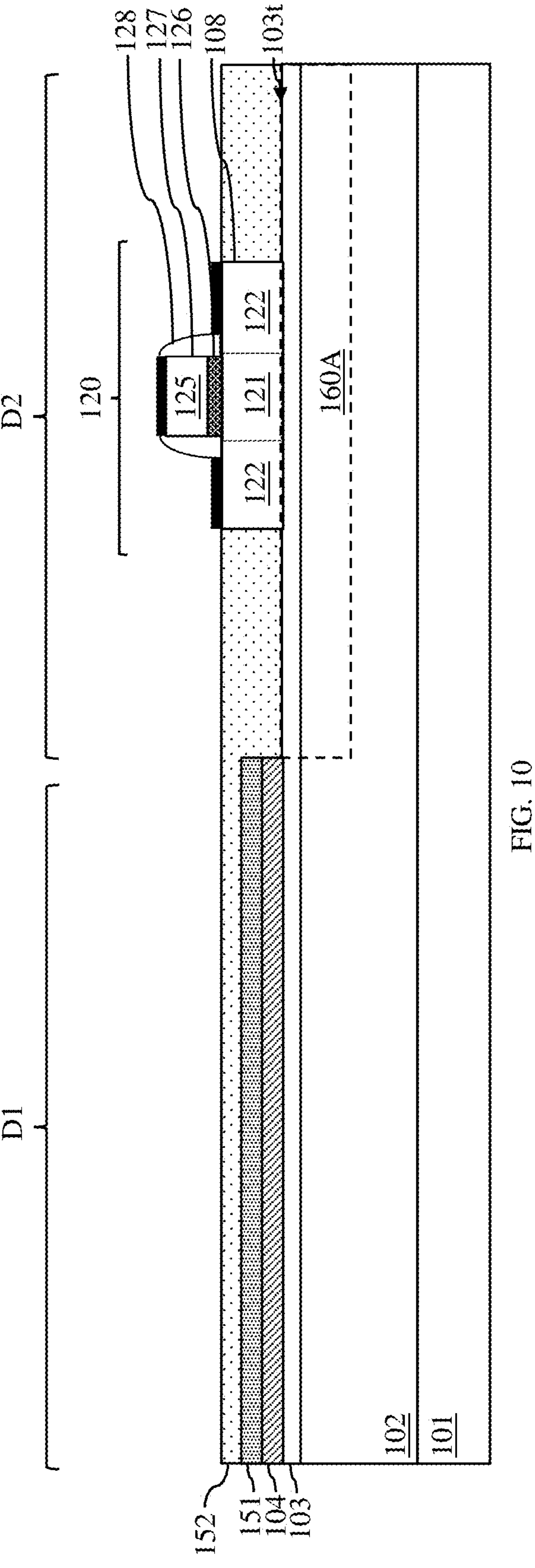

A silicon device 120 can be formed using silicon-based layer 108 (see process 216 and FIG. 10). As illustrated, a FET (as described in detail above with regard to the structure embodiments) can be formed at process 216. Such a FET can be formed, for example, using conventional complementary metal oxide semiconductor (CMOS) processing techniques. As such techniques are known in the art, they have been omitted from this specification in order to allow the reader to focus on the salient aspects of the disclosed embodiments. Alternatively, any other type of silicon device could be formed at process 216 using silicon-based layer 108.

A third DM layer 153 can be formed (e.g., by CVD or other suitable deposition technique) over the partially completed structure (see process 218 and FIG. 11). Third DM layer 153 can include, for example, an optional silicon nitride layer and a silicon dioxide layer on the silicon nitride layer. Alternatively, third DM layer 153 can include one or more layers of any other suitable DM. A polishing processes (e.g., a conventional chemical mechanical polishing (CMP) process) can be performed so that the top surface of second DM layer 152 is essentially planar across D1 and D2.

Figure 11A:
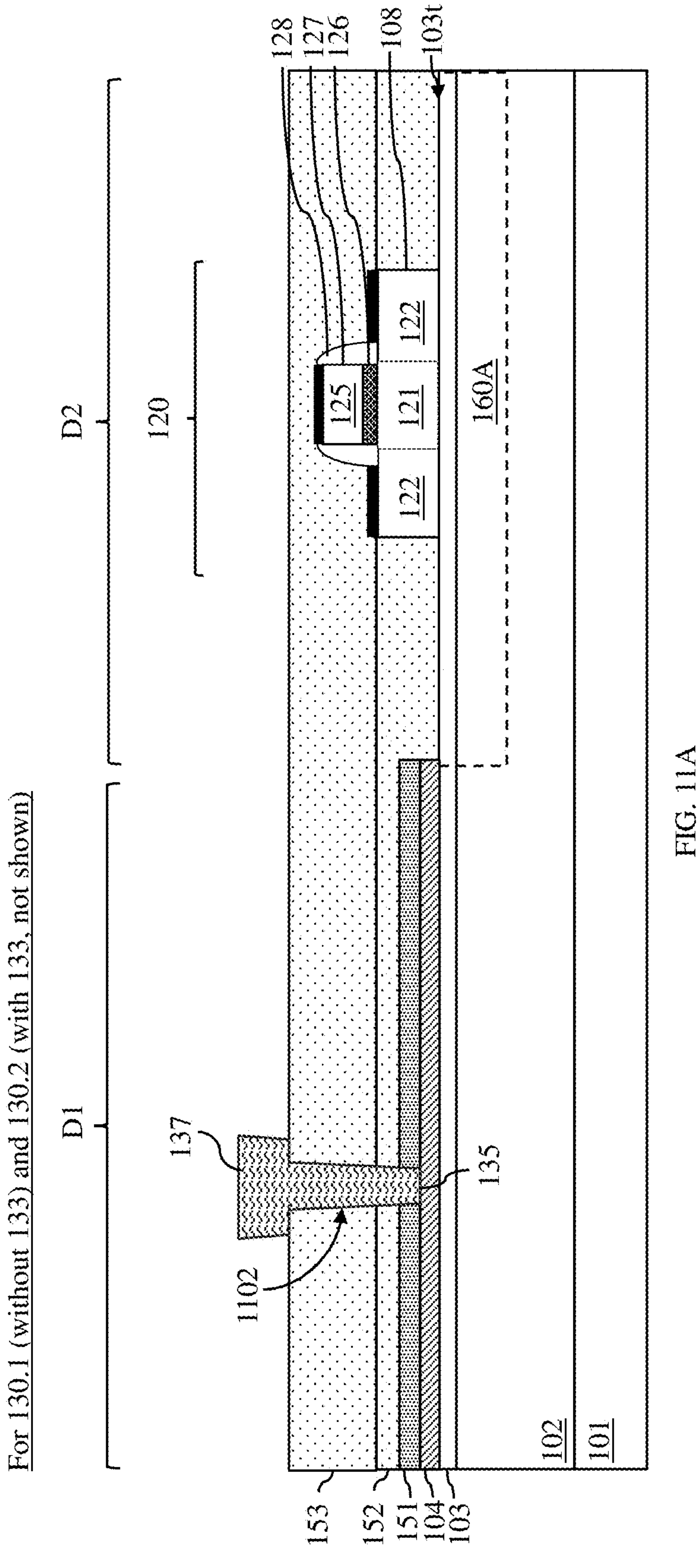
Figure 11B:
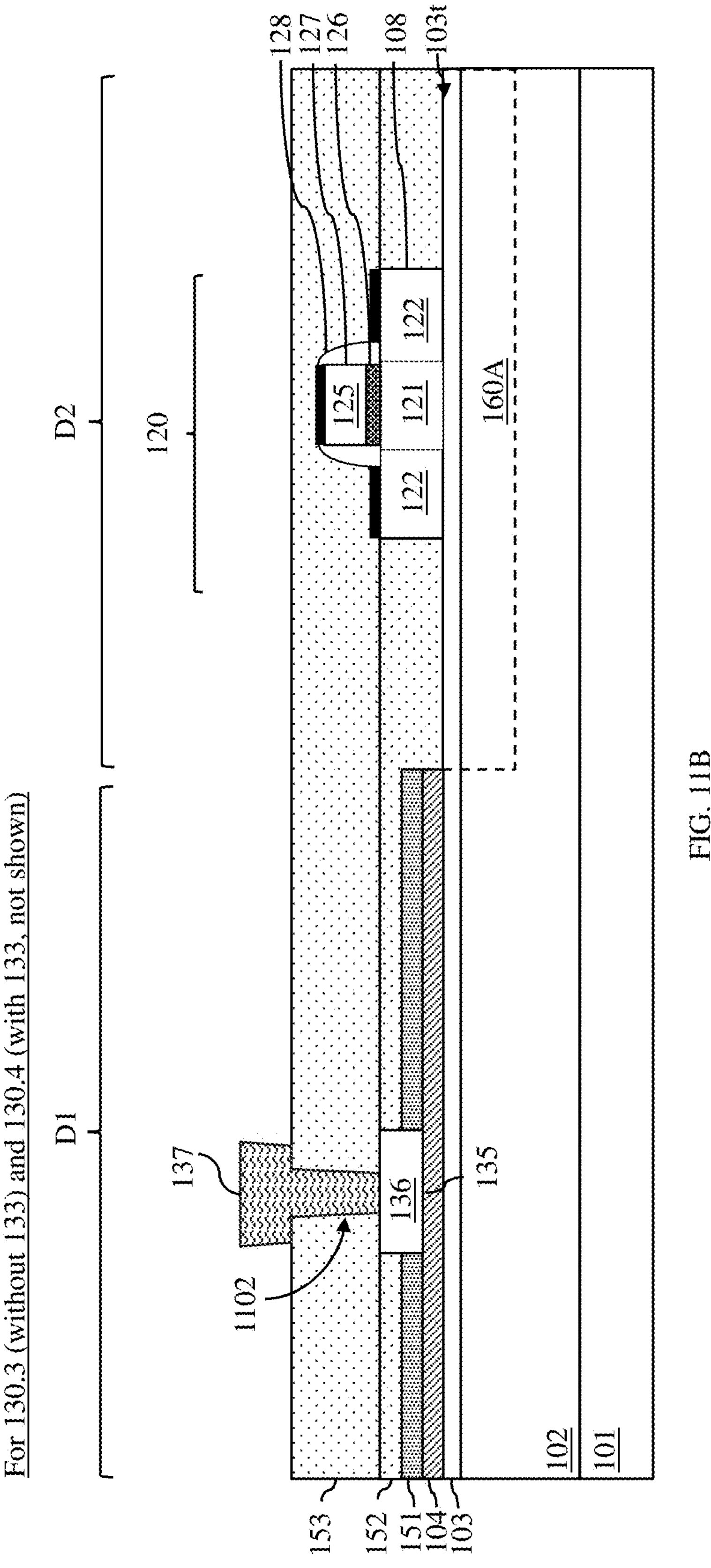
Figure 11C:
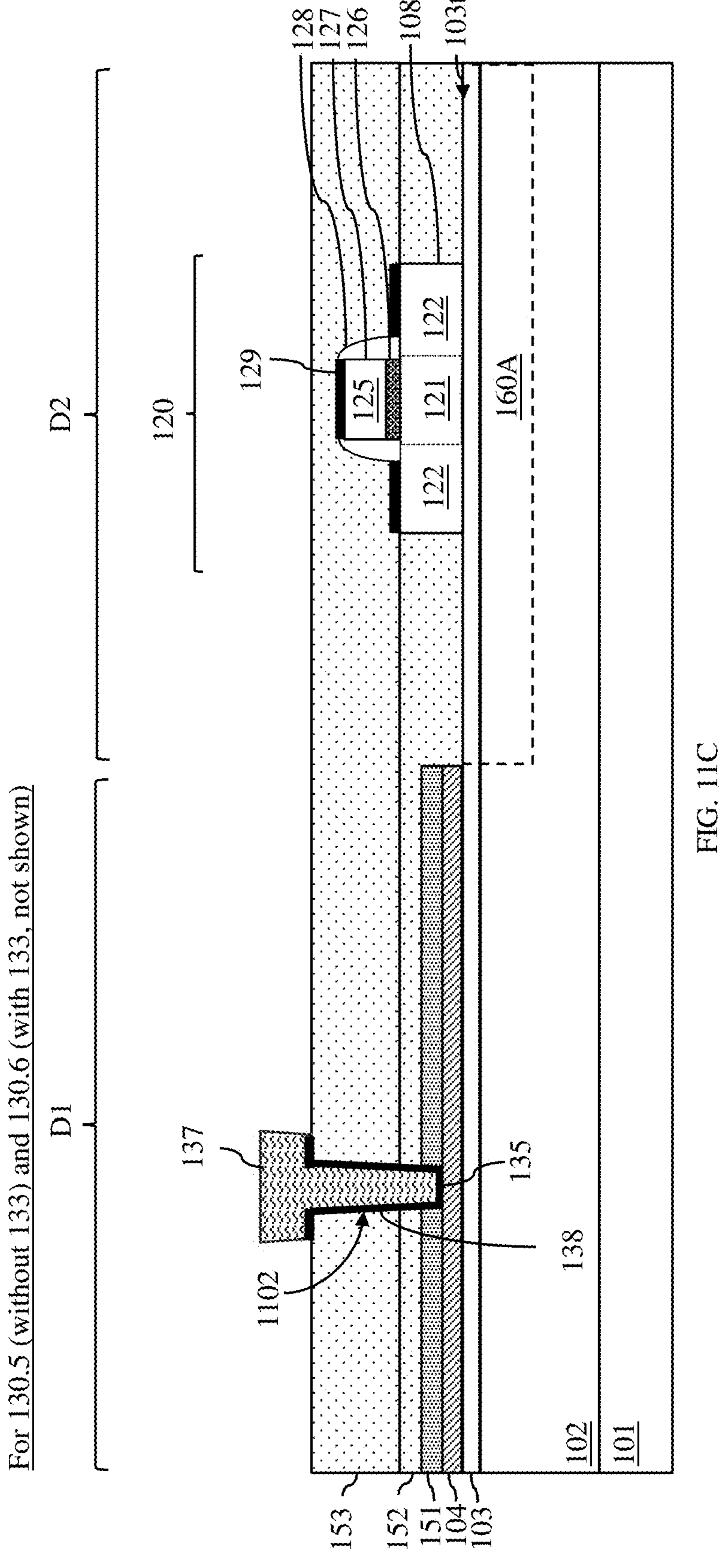

In D1, a gate terminal 135 for a III-V semiconductor device 130 can then be formed (see process 220). To form the gate terminal 135, a gate opening 1102 can be formed (e.g., using conventional lithographic patterning and etch techniques) and one or more gate layers can be formed in the gate opening. For example, as illustrated in FIG. 11A, if the III-V semiconductor device being formed is a D-Mode HEMT (e.g., see III-V semiconductor devices 130.1 in FIG. 1.1A and 1.1B and 130.2 in FIG. 1.2A and 1.2B), gate opening 1102 can extend through third DM layer 153, second DM layer 152, and first DM layer 151 to barrier layer 104. A gate conductor material 137 (e.g., aluminum, gold, titanium, titanium nitride, nickel/gold, or titanium/platinum/gold, for a Schottky contact gate terminal) can be deposited over the top surface of third DM layer 153 and into gate opening 1102. As illustrated in FIG. 11B, if the III-V semiconductor device being formed is an E-Mode HEMT (e.g., see III-V semiconductor devices 130.3 in FIG. 1.3A and 1.3B and 130.4 in FIG. 1.4A and 1.4B), gate opening 1102 can extend through third DM layer 153, second DM layer 152 to P-type III-V semiconductor layer 136. A gate conductor material 137 (e.g., aluminum, gold, titanium, titanium nitride, nickel/gold, or titanium/platinum/gold, for a Schottky contact gate terminal) can be deposited over the top surface of third DM layer 153 and into gate opening 1102. As illustrated in FIG. 11C, if the III-V semiconductor device being formed is an E-Mode MISHEMT (e.g., see III-V semiconductor devices 130.5 in FIG. 1.5A and 1.5B and 130.6 in FIG. 1.6A and 1.6B), gate opening 1102 can extend through third DM layer 153, second DM layer 152, and first DM layer 151 to barrier layer 104. A gate dielectric layer 138 (e.g., a high-K gate dielectric layer) can be deposited so as to line the gate opening 1102. Then, a gate conductor material 137 can be deposited over the top surface of third DM layer 153 and into gate opening 1102. Since gate dielectric layer 138 will physically separate barrier layer 104 from gate conductor material 137, in the E-mode MISHEMT a Schottky contact gate terminal is not required and gate conductor material 137 could include one or more layers of any suitable gate conductor material (e.g., gate metal(s), gate metal alloy(s), doped polysilicon, etc.). In any case, gate conductor material 137 can further be lithographically patterned and etched so as to be essentially T-shaped with a lower portion in gate opening 1102 and an upper portion above and wider than the lower portion.

For purposes of illustration, additional processes are illustrated in the figures with respect to formation of a D-mode HEMT (e.g., as shown in FIG. 1.1A-1.2B) where gate terminal 135 is devoid of either a P-type III-V semiconductor layer or a gate dielectric layer. However, it should be understood that essentially the same processes can be performed during formation of an E-mode HEMT (e.g., as shown in FIG. 1.3A-1.4B) or an E-mode MISHEMT (e.g., as shown in FIG. 1.5A-1.6B).

Figure 12:
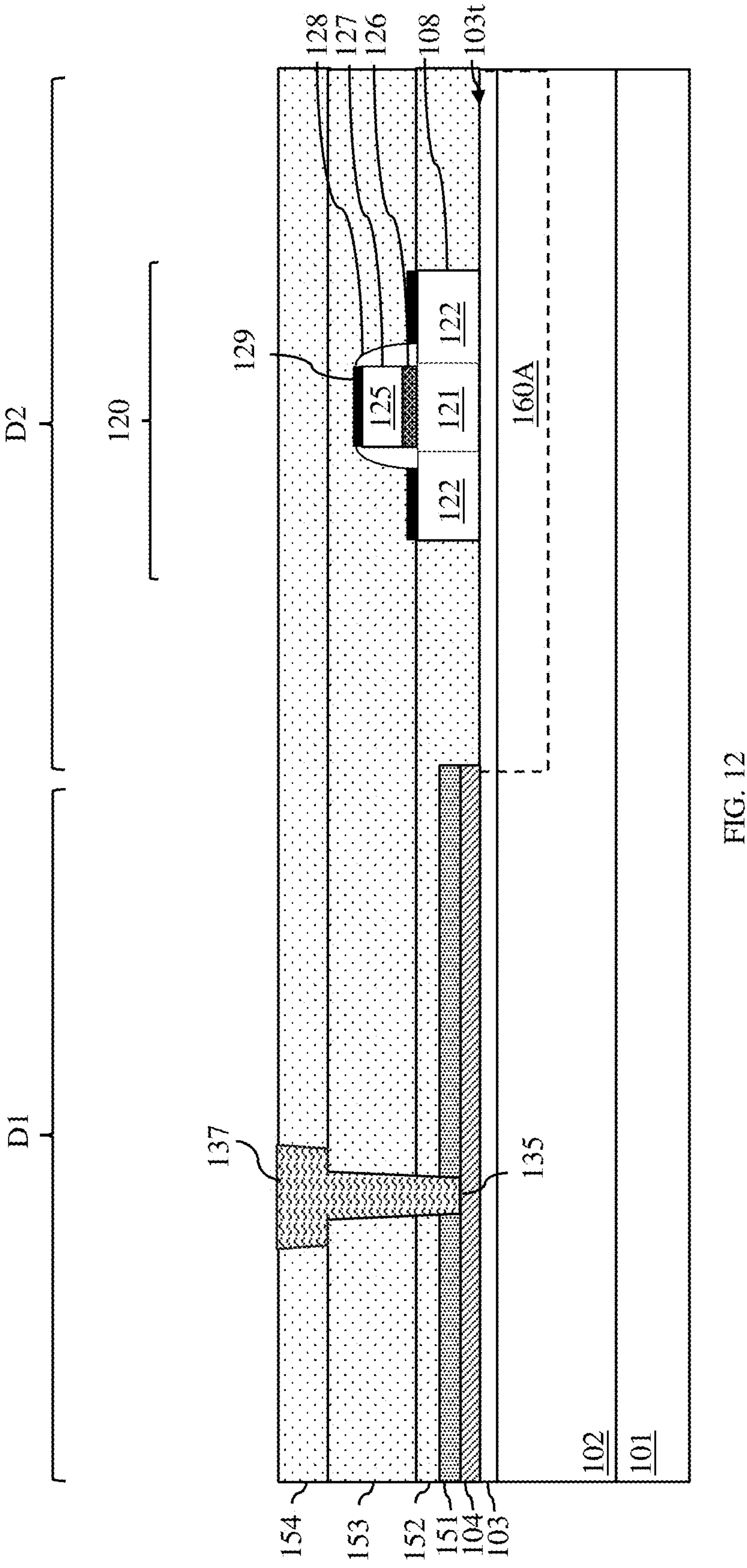

A fourth DM layer 154 can subsequently be formed (e.g., by CVD or other suitable deposition technique) on third DM layer 153 (see process 222 and FIG. 12). Fourth DM layer 154 can include, for example, an optional silicon nitride layer and a silicon dioxide layer on the silicon nitride layer. Alternatively, fourth DM layer 154 can include one or more layers of any other suitable DM. A polishing processes (e.g., a conventional CMP process) can be performed so that the top surface of fourth DM layer 154 is essentially planar across D1 and D2.

Figure 13:
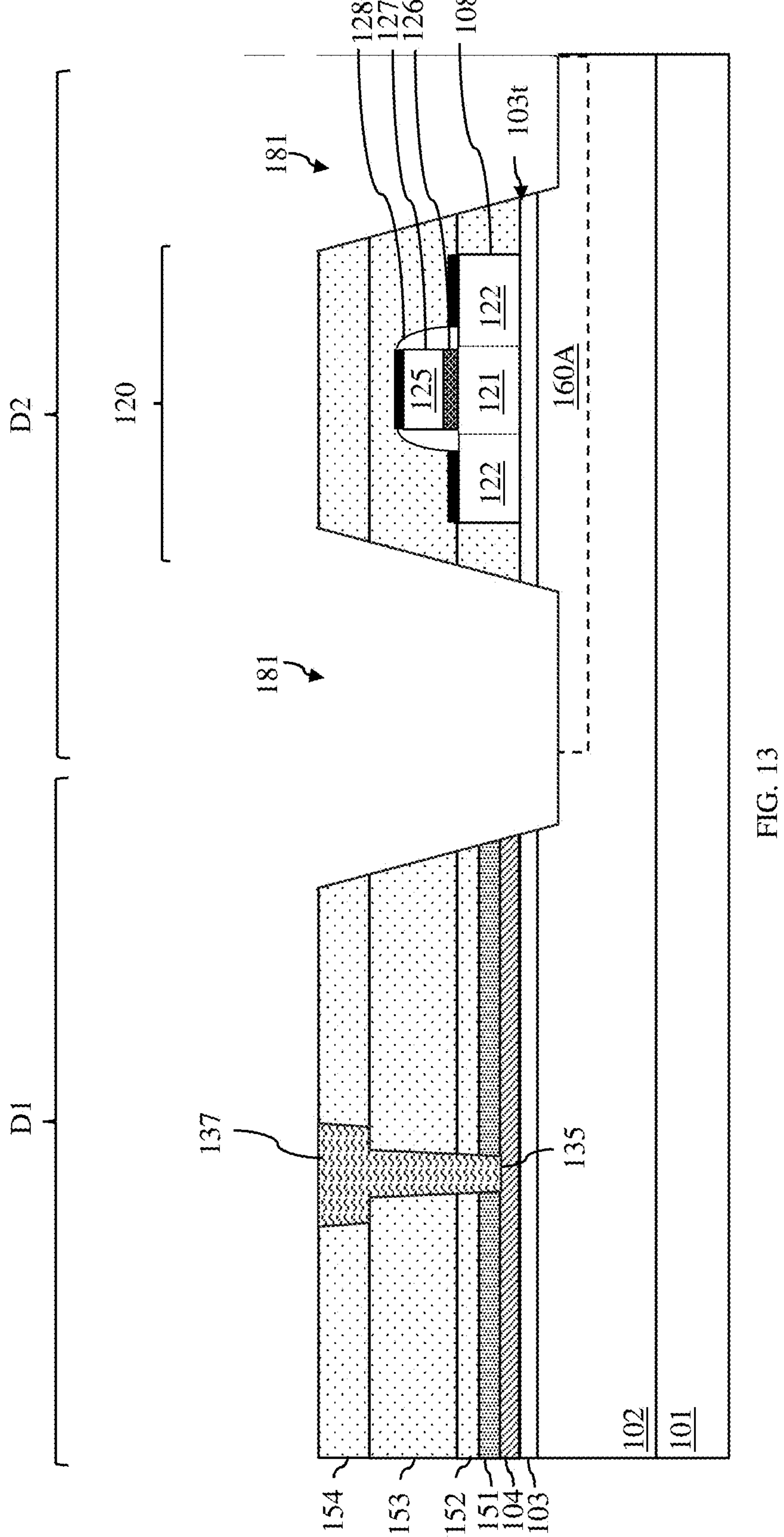
Figure 14:
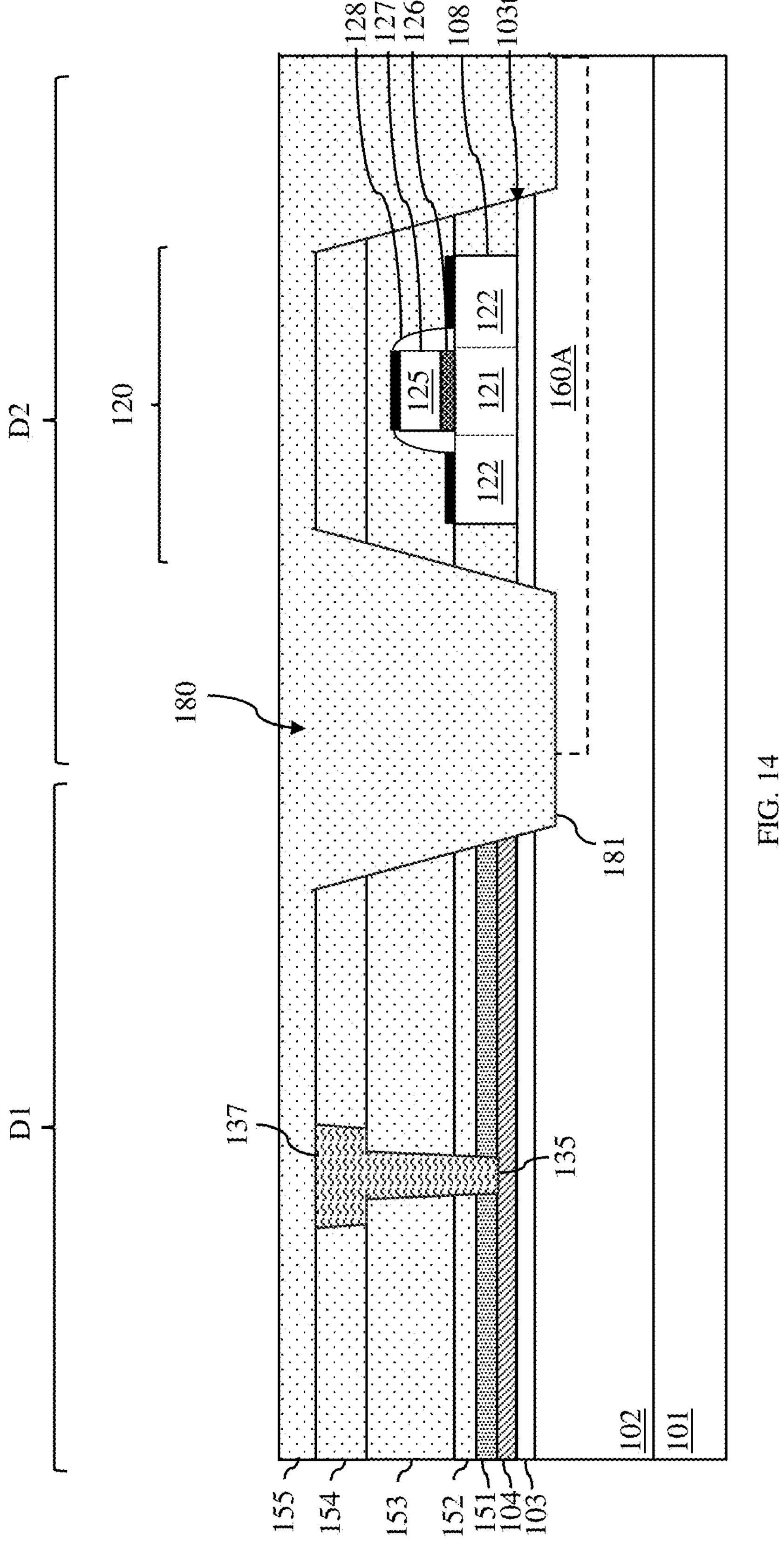

Optionally, a trench isolation region 180 can be formed in the DM layers between D1 and D2 (see processes 224-226 and FIGS. 13-14). For example, a trench 181 can be formed (e.g., lithographically patterned and etched) so that it extends from the top surface of fourth DM layer 154 through the III-V semiconductor surface 103*t* between D1 and D2. Optionally, trench 181 can extend completely through channel layer 103 and into buffer layer 102. Optionally, the bottom of trench 181 can be above the bottom of the isolation well, as illustrated. Alternatively, the trench 181 could extend to or below the bottom of the isolation well. A fifth DM layer 155 can be formed (e.g., by CVD or other suitable deposition technique) on fourth DM layer 154 and further so as to fill trench 181. For example, fifth DM layer 155 can include, for example: an optional silicon nitride layer that covers the top surface of fourth DM layer 154 and that further lines the trench and a silicon dioxide layer on the silicon nitride layer and filling the trench 181. A polishing processes (e.g., a conventional CMP process) can be performed so that the top surface of fourth DM layer 154 is essentially planar across D1 and D2.

Figure 15:
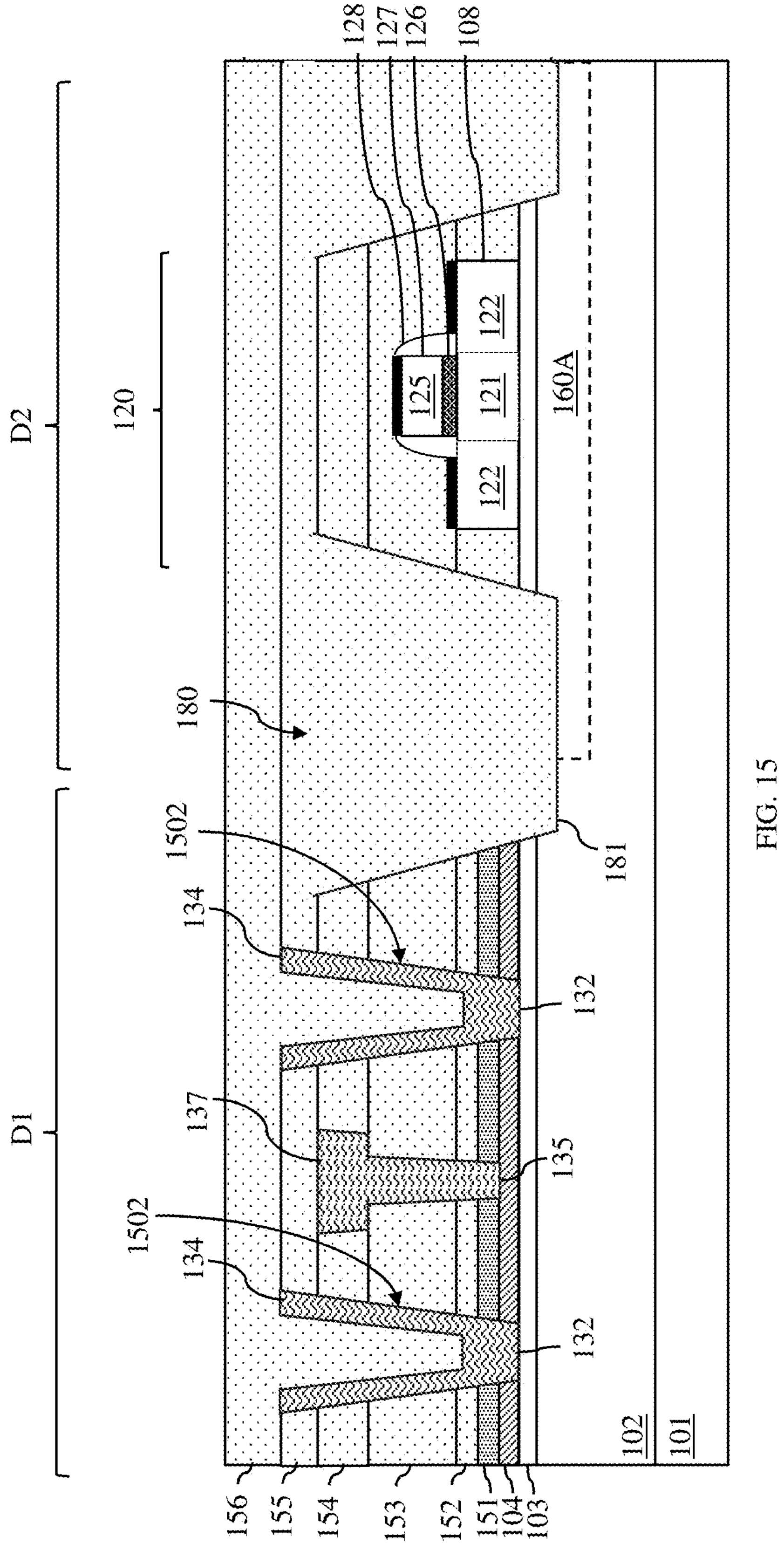

In D1, source/drain terminals 132 for the III-V semiconductor device 130 can then be formed (see process 228 and FIG. 15). To form source/drain terminals 132 at process 228, source/drain openings 1502 can be formed (e.g., lithographically patterned and etched) so as to extend from the top surface of fifth DM layer 155 down through first DM layer 151 to channel layer 103, as illustrated in FIG. 15 (e.g., see also source/drain terminals 132 in the III-V semiconductor device 130.1 of FIG. 1.1A and 1.1B, 130.3 of FIG. 1.3A and 1.3B, and 130.5 of FIG. 1.5A and 1.5B). Alternatively, if raised III-V semiconductor source/drain regions 133 have been formed at process 204, then the source/drain openings can extend from the top surface of fifth DM layer 155 down to raised III-V semiconductor source/drain regions 133 (e.g., see source/drain terminals 132 in the III-V semiconductor device 130.2 of FIG. 1.2A and 1.2B, 130.4 of FIG. 1.4A and 1.3B, and 130.6 of FIG. 1.6A and 1.6B). In any case, a metallic source/drain layer 134 can be formed (e.g., by any suitable metal deposition technique) over fifth DM layer 155 and into source/drain openings 1502 (e.g., at least lining and optionally filling the source/drain openings 1502). Metallic source/drain layer 134 can include one or more metal or metal alloy layers suitable for creating ohmic contacts at the metal-semiconductor junctions. Such metallic source/drain layers could include, for example, titanium/aluminum/titanium nitride, titanium/aluminum/titanium/gold, or molybdenum/aluminum/molybdenum/gold. A polishing processes (e.g., a conventional CMP process) can then be performed to remove metallic source/drain material from above the top surface of fifth DM layer 155.

A sixth DM layer 156 can subsequently be formed (e.g., by CVD or other suitable deposition technique) on fifth DM layer 155 and can fill any remaining space within source/drain openings (e.g., if the metallic source/drain layer 134 only line each source/drain opening) (see process 230 and FIG. 1.1A-1.6B). Sixth DM layer 156 can include, for example, an optional silicon nitride layer and a silicon dioxide layer on the silicon nitride layer. Alternatively, sixth DM layer 156 can include one or more layers of any other suitable DM. A polishing processes (e.g., a conventional CMP process) can be performed so that the top surface of sixth DM layer 156 is essentially planar across D1 and D2. Additional processing can include, but is not limited to, formation of middle of the line (MOL) contacts extending through the DM layers down to III-V semiconductor device 130 and silicon device 120. Techniques for forming MOL contacts are well known in the art and, thus, the details thereof have been omitted from the specification in order to allow the reader to focus on the salient aspects of the disclosed embodiments.

Although not specifically illustrated in FIG. 1.1A-1.6B, in some embodiments, silicon device 120 could be electrically connected to III-V semiconductor device 130. For example, silicon device 120 could be a PFET, which is electrically connected to III-V semiconductor device 130 for threshold voltage (VT) tuning.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a stack of III-V semiconductor layers on a substrate in a first area and a second area, wherein the stack has a III-V semiconductor surface;

a barrier layer only in the first area on the III-V semiconductor surface;

a first dielectric material layer only in the first area on the barrier layer;

a second dielectric material layer in the first area on the first dielectric material layer and in the second area on the III-V semiconductor surface;

a III-V semiconductor device in the first area and including the barrier layer;

a silicon device in the second area and including a silicon-based layer extending through the second dielectric material layer to the III-V semiconductor surface; and an isolation well in the second area and including a doped region within the stack adjacent to the III-V semiconductor surface.

2. The structure of claim 1, further comprising a trench isolation region extending through the second dielectric material layer down into the stack, wherein the trench isolation region is positioned laterally between the III-V semiconductor device and the silicon device, wherein the doped region is below the silicon device, and extends laterally beyond opposing ends of the silicon-based layer such that an outer edge of the doped region is below the trench isolation region.

3. The structure of claim 1, wherein the silicon-based layer is any of monocrystalline, monocrystalline with crystalline defects, and polycrystalline.

4. The structure of claim 1, wherein the silicon device is a field effect transistor.

5. The structure of claim 1, wherein the III-V semiconductor device is a depletion-mode transistor.

6. The structure of claim 5, wherein the depletion-mode transistor includes raised III-V semiconductor source/drain regions.

7. The structure of claim 1, wherein the III-V semiconductor device is an enhancement-mode transistor including a gate terminal, and wherein the gate terminal includes: a gate conductor layer and one of:

a P-type III-V semiconductor layer between the barrier layer and the gate conductor layer; and a gate dielectric layer between the barrier layer and the gate conductor layer.

8. The structure of claim 7, wherein the enhancement-mode transistor includes raised III-V semiconductor source/drain regions.

9. A structure comprising:

a stack of III-V semiconductor layers on a substrate in a first area and a second area, wherein the stack has a III-V semiconductor surface;

a barrier layer only in the first area on the III-V semiconductor surface;

a first dielectric material layer only in the first area on the barrier layer;

a second dielectric material layer in the first area on the first dielectric material layer and in the second area on the III-V semiconductor surface;

a III-V semiconductor device in the first area and including the barrier layer;

a silicon device in the second area and including the silicon-based layer; and an isolation well in the second area and including a doped region within the stack adjacent to the III-V semiconductor surface, wherein the doped region is positioned laterally between undoped regions of the stack below the III-V semiconductor device in the first area and below the silicon device in the second area.

10. The structure of claim 9, further comprising a trench isolation region extending through the second dielectric material layer down into the stack, wherein the trench isolation region is positioned laterally between the III-V semiconductor device and the silicon device, and wherein an outer edge of the doped region is below the trench isolation region.

11. The structure of claim 9, wherein the silicon device includes a field effect transistor.

12. The structure of claim 9, wherein the III-V semiconductor device is a depletion-mode transistor.

13. The structure of claim 12, wherein the depletion-mode transistor includes raised III-V semiconductor source/drain regions.

14. The structure of claim 9, wherein the III-V semiconductor device is an enhancement-mode transistor including a gate terminal and wherein the gate terminal includes: a gate conductor layer and one of:

a P-type III-V semiconductor layer between the barrier layer and the gate conductor layer; and a gate dielectric layer between the barrier layer and the gate conductor layer.

15. The structure of claim 14, wherein the enhancement-mode transistor includes raised III-V semiconductor source/drain regions.

16. A method comprising:

forming a stack of III-V semiconductor layers above a substrate in a first area and a second area, wherein the stack has a III-V semiconductor surface;

forming a barrier layer only in the first area on the III-V semiconductor surface;

forming a first dielectric material layer only in the first area on the barrier layer;

forming a second dielectric material layer in the first area on the first dielectric material layer and in the second area on the III-V semiconductor surface;

forming a III-V semiconductor device in the first area and a silicon device in the second area, wherein the III-V semiconductor device includes the barrier layer, and wherein the silicon device includes a silicon-based layer extending through the second dielectric material layer to the III-V semiconductor surface in the second area; and forming an isolation well in the second area and including a doped region within the stack adjacent to the III-V semiconductor surface.

17. The method of claim 16, wherein the doped region is any of:

below the silicon device extending laterally beyond opposing ends of the silicon-based layer without further extending below the III-V semiconductor device; and positioned laterally between undoped regions, wherein the undoped regions are below the silicon device and the III-V semiconductor device.

18. The method of claim 16, wherein the silicon-based layer is epitaxially grown on the III-V semiconductor surface and is any of monocrystalline, monocrystalline with crystalline defects, and polycrystalline.

19. The method of claim 16, wherein the silicon device is a field effect transistor.

20. The method of claim 16, wherein the III-V semiconductor device is any of a depletion-mode transistor and an enhancement-mode transistor.

* * * * *